(12) United States Patent
Yoshimura et al.

(10) Patent No.: US 8,395,303 B2
(45) Date of Patent: Mar. 12, 2013

(54) IMPEDANCE MATCHING PIEZOELECTRIC TRANSFORMER

(75) Inventors: Kenichi Yoshimura, Kagoshima (JP); Michiaki Nishimura, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 528 days.

(21) Appl. No.: 12/670,853

(22) PCT Filed: Jul. 28, 2008

(86) PCT No.: PCT/JP2008/063536
§ 371 (c)(1),
(2), (4) Date: Jan. 26, 2010

(87) PCT Pub. No.: WO2009/017096
PCT Pub. Date: Feb. 5, 2009

(65) Prior Publication Data
US 2010/0188185 A1   Jul. 29, 2010

(30) Foreign Application Priority Data
Jul. 27, 2007   (JP) .................................. 2007-196079

(51) Int. Cl.
*H01L 41/08* (2006.01)
(52) U.S. Cl. ...................................... 310/359
(58) Field of Classification Search .................. 310/359
See application file for complete search history.

(56) References Cited

U.S. PATENT DOCUMENTS

| | | | |
|---|---|---|---|
| 5,847,491 A | 12/1998 | Taihaku et al. | |
| 5,894,185 A | 4/1999 | Asada et al. | |
| 6,078,127 A * | 6/2000 | Saito et al. | 310/363 |
| 6,140,747 A * | 10/2000 | Saito et al. | 310/359 |
| 6,342,753 B1 * | 1/2002 | Oliver et al. | 310/359 |
| 6,989,626 B2 * | 1/2006 | Takeda et al. | 310/359 |

FOREIGN PATENT DOCUMENTS

| | | |
|---|---|---|
| JP | 10-12940 | 6/1996 |
| JP | 11-154768 | 6/1996 |
| JP | H09-083034 | 3/1997 |
| JP | 2001-185775 | 7/2001 |
| JP | 2002-289937 | 10/2002 |

(Continued)

OTHER PUBLICATIONS

Machine Translation JP-2004128431A.*
Office Action dated Jul. 3, 2012, issued in counterpart Japanese Application No. 2009-525397.

(Continued)

*Primary Examiner* — J. San Martin
(74) *Attorney, Agent, or Firm* — Procopio, Cory, Hargreaves & Savitch LLP

(57) ABSTRACT

To provide a piezoelectric transformer which can reduce the capacity of an input unit and realize a impedance matching with a drive circuit of an input side. A piezoelectric transformer includes: a piezoelectric substrate (11) having both main surfaces of a rectangular shape; and input side electrodes (12, 13, 15, 16) and output side electrodes (14, 17) formed on the both main surfaces of the piezoelectric substrate (11). A pair of opposing input side electrodes (12, 13, 15, 16) are arranged on the both surfaces of the piezoelectric substrate (11) in the first input unit (A1) and the second input unit (A2). At least one of the pair of input side electrodes (12, 13, 15, 16) is a partial electrode arranged at the center portion of the main surface of the piezoelectric substrate (11) in the first input unit (A1) and the second input unit (A2).

10 Claims, 41 Drawing Sheets

FOREIGN PATENT DOCUMENTS

| | | |
|---|---|---|
| JP | 2003-017772 | 1/2003 |
| JP | 2004-128431 | 4/2004 |
| JP | 2004-140204 | 5/2004 |

OTHER PUBLICATIONS

PCT/JP2008/063536, PCT/ISA/210—international search report.

* cited by examiner

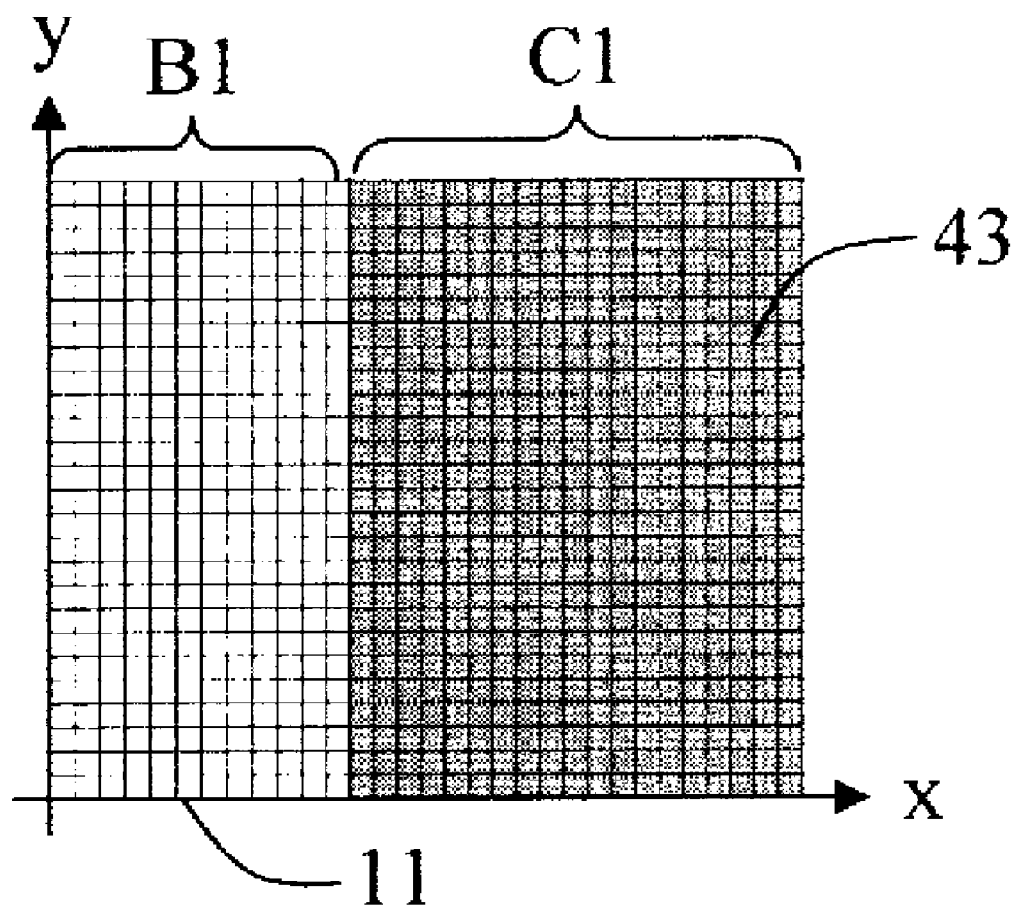

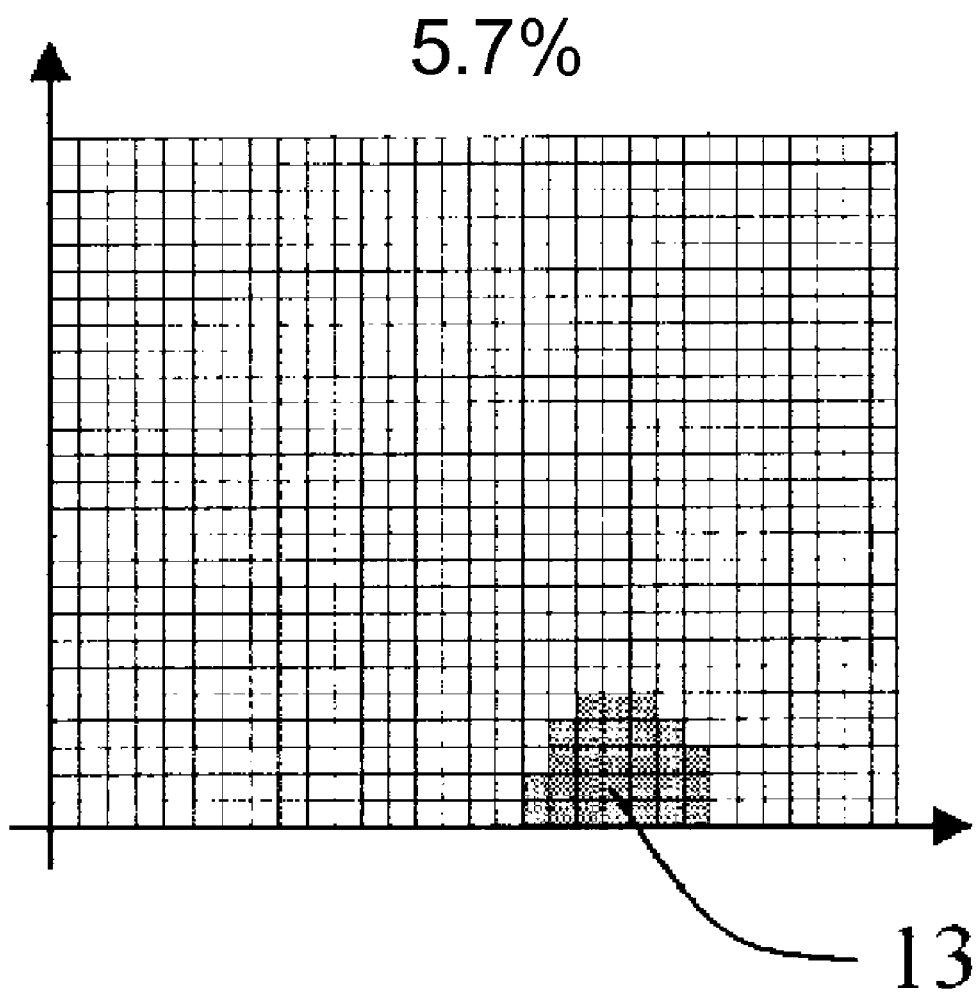

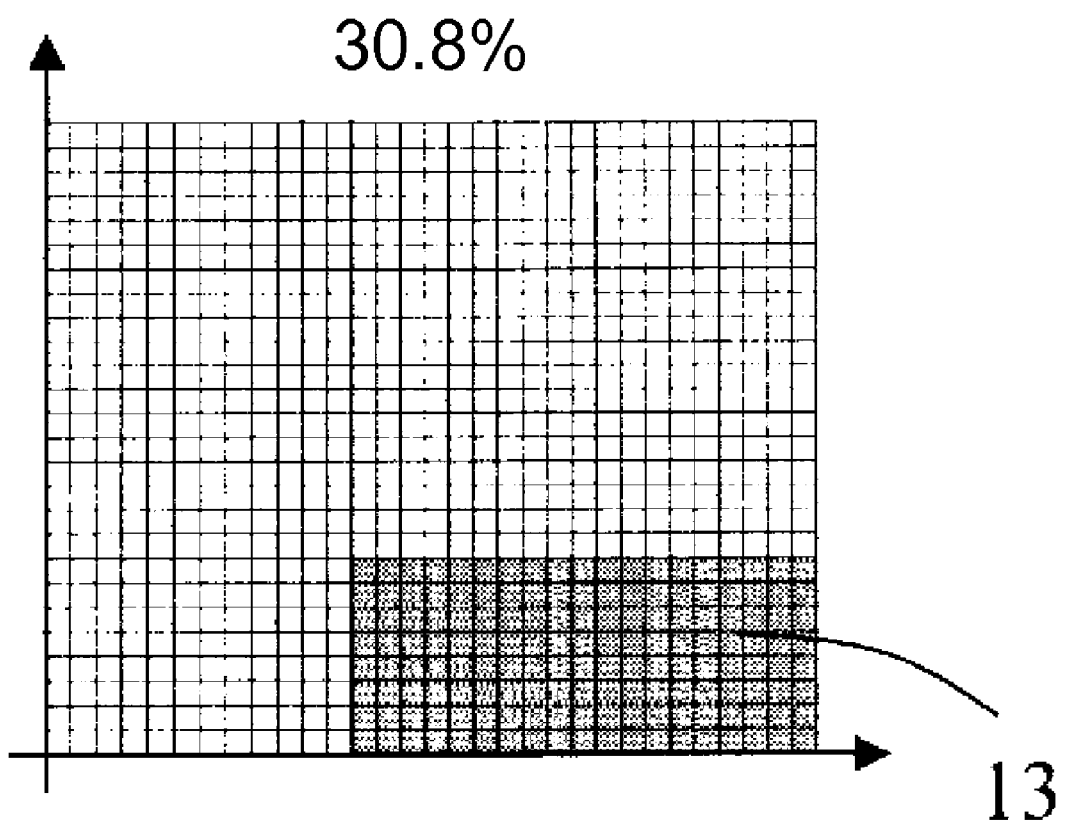
Figure 9S2

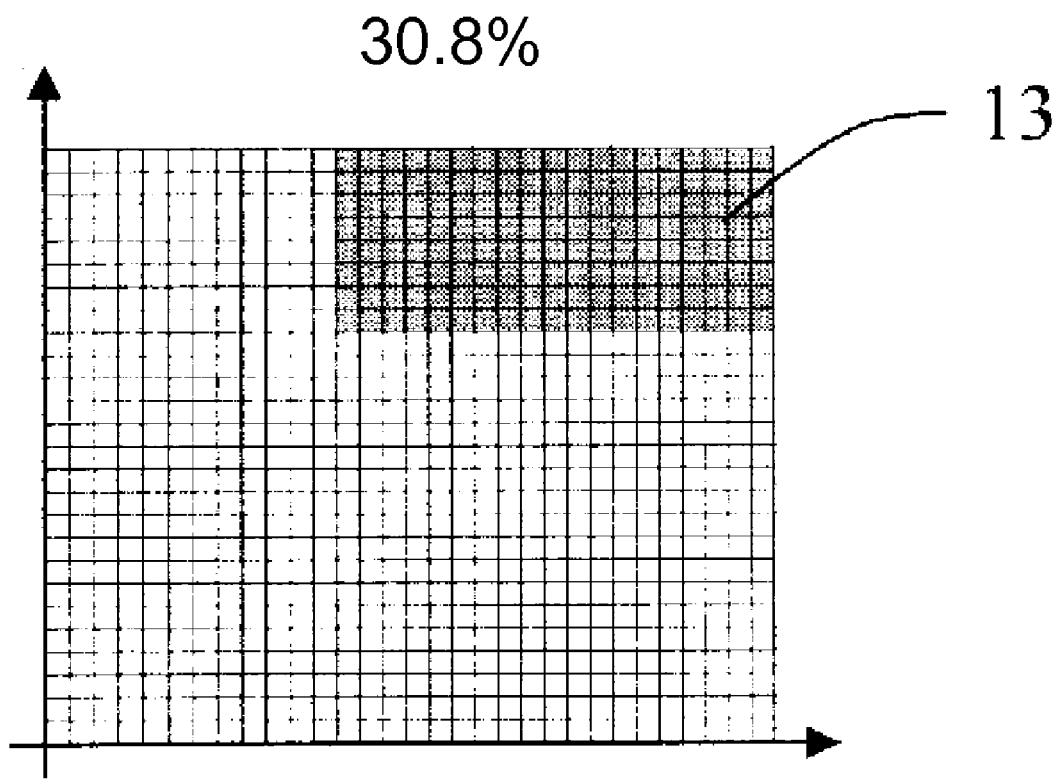
Figure 9S3

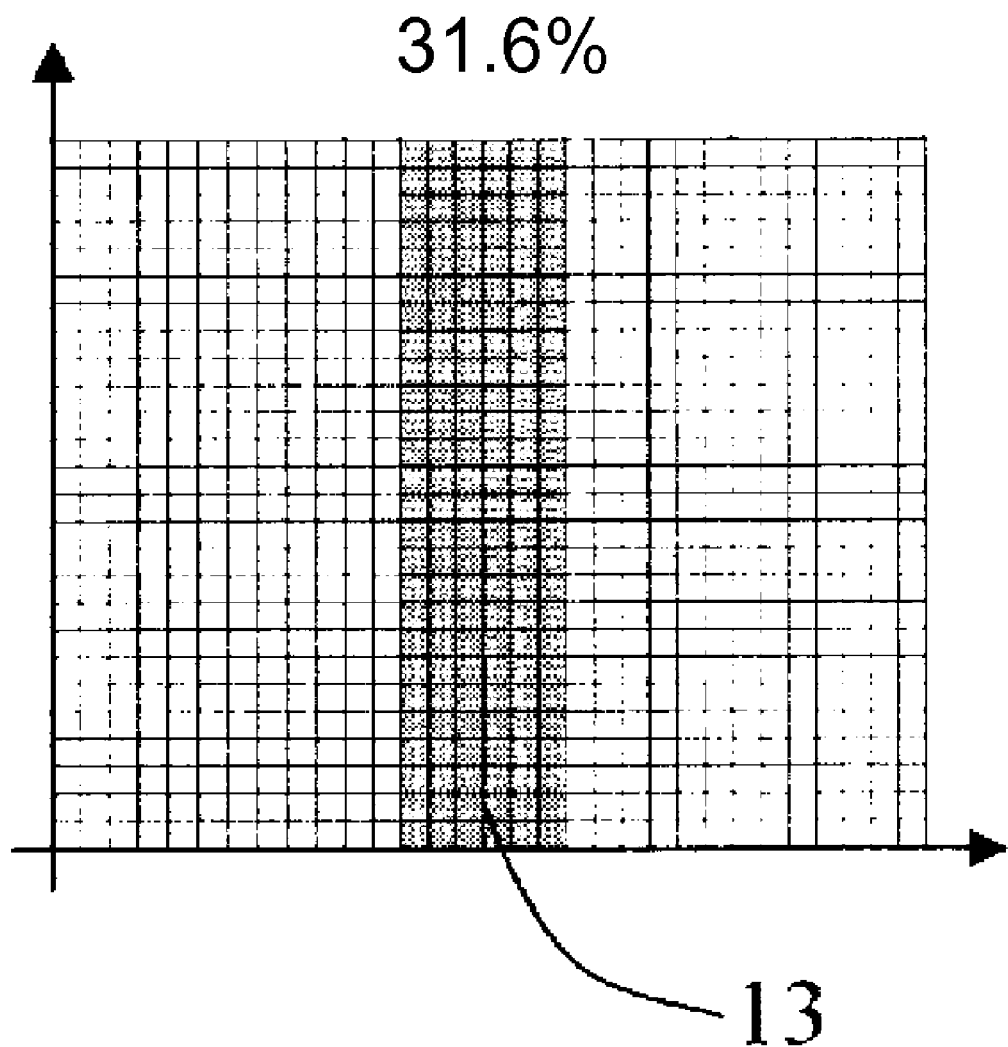
Figure 9S4

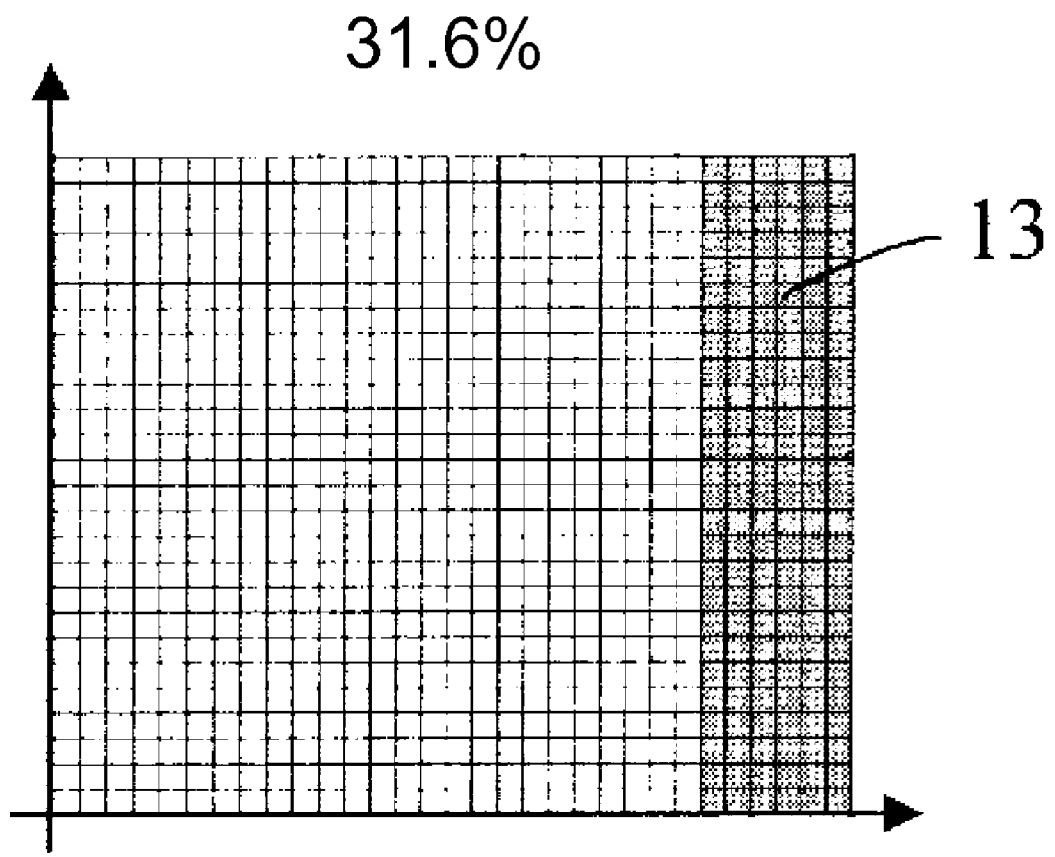
Figure 9S5

Figure 9S6
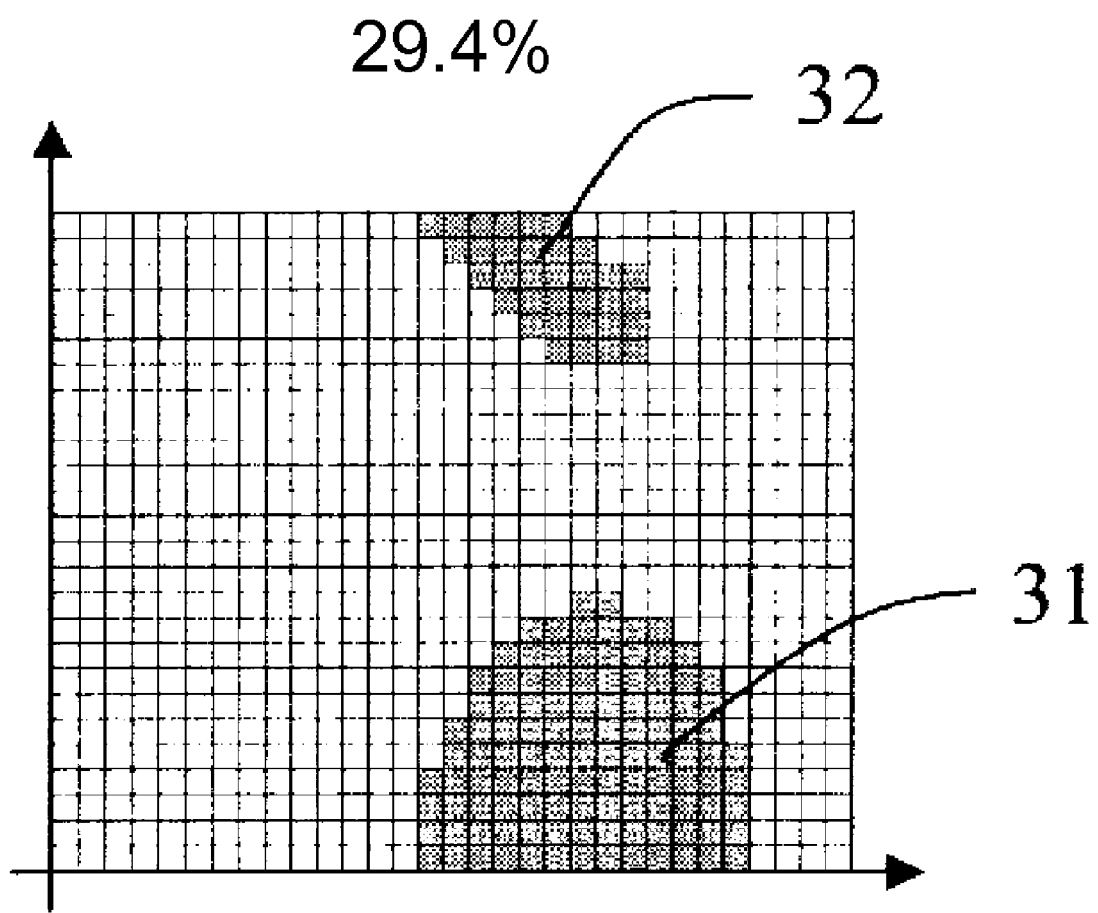
29.4%
32
31

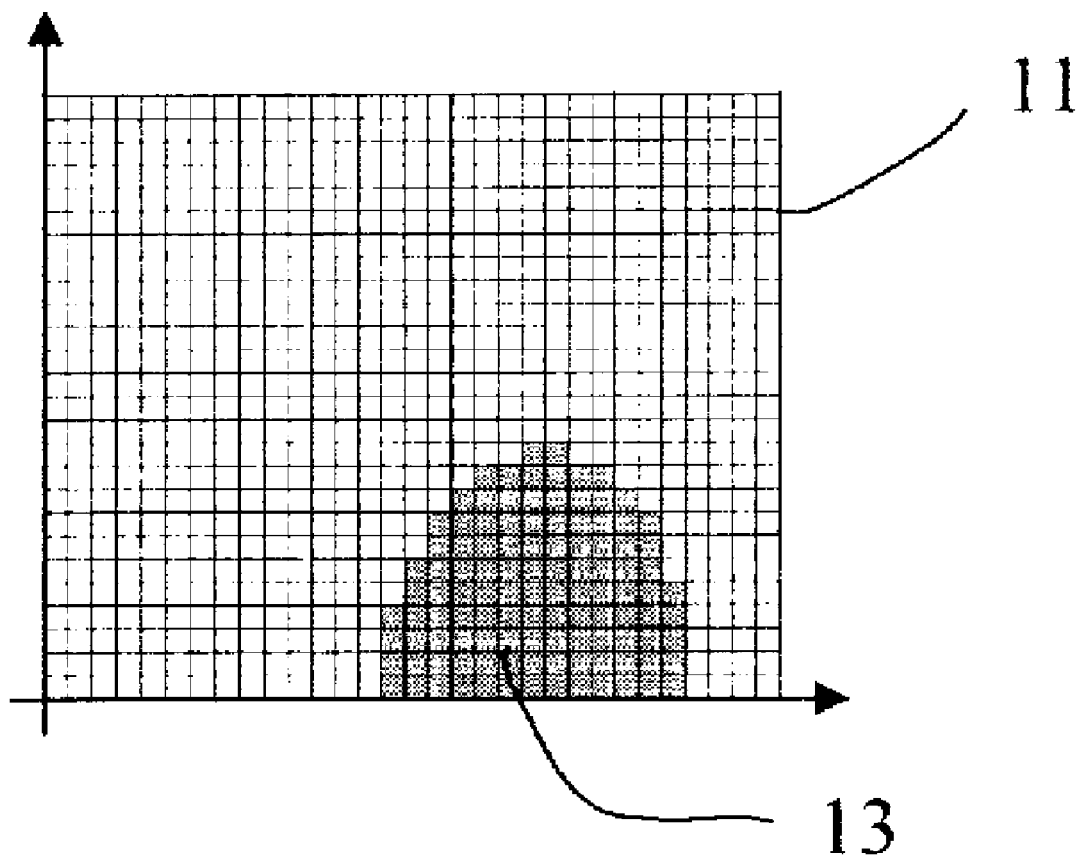
Figure 9S7

Figure 9S8
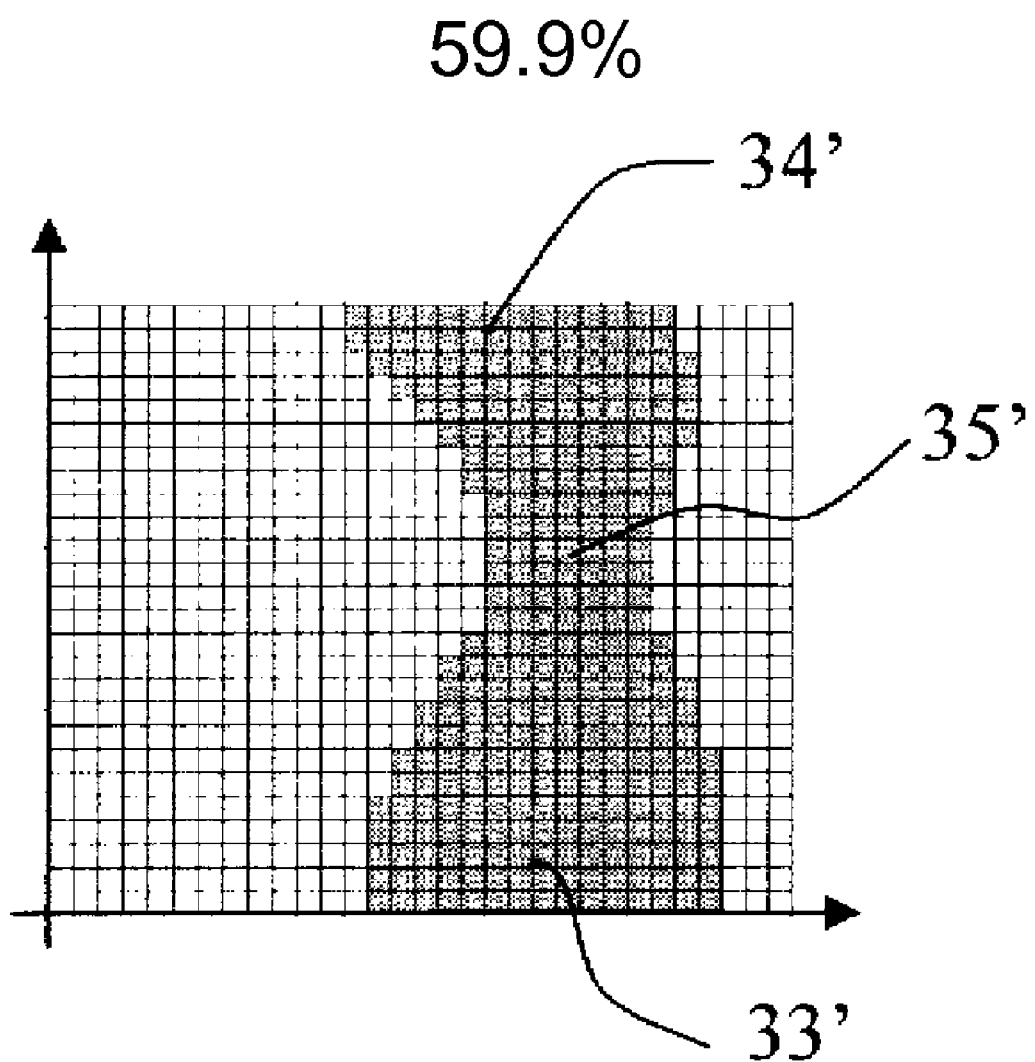

Figure 13A1
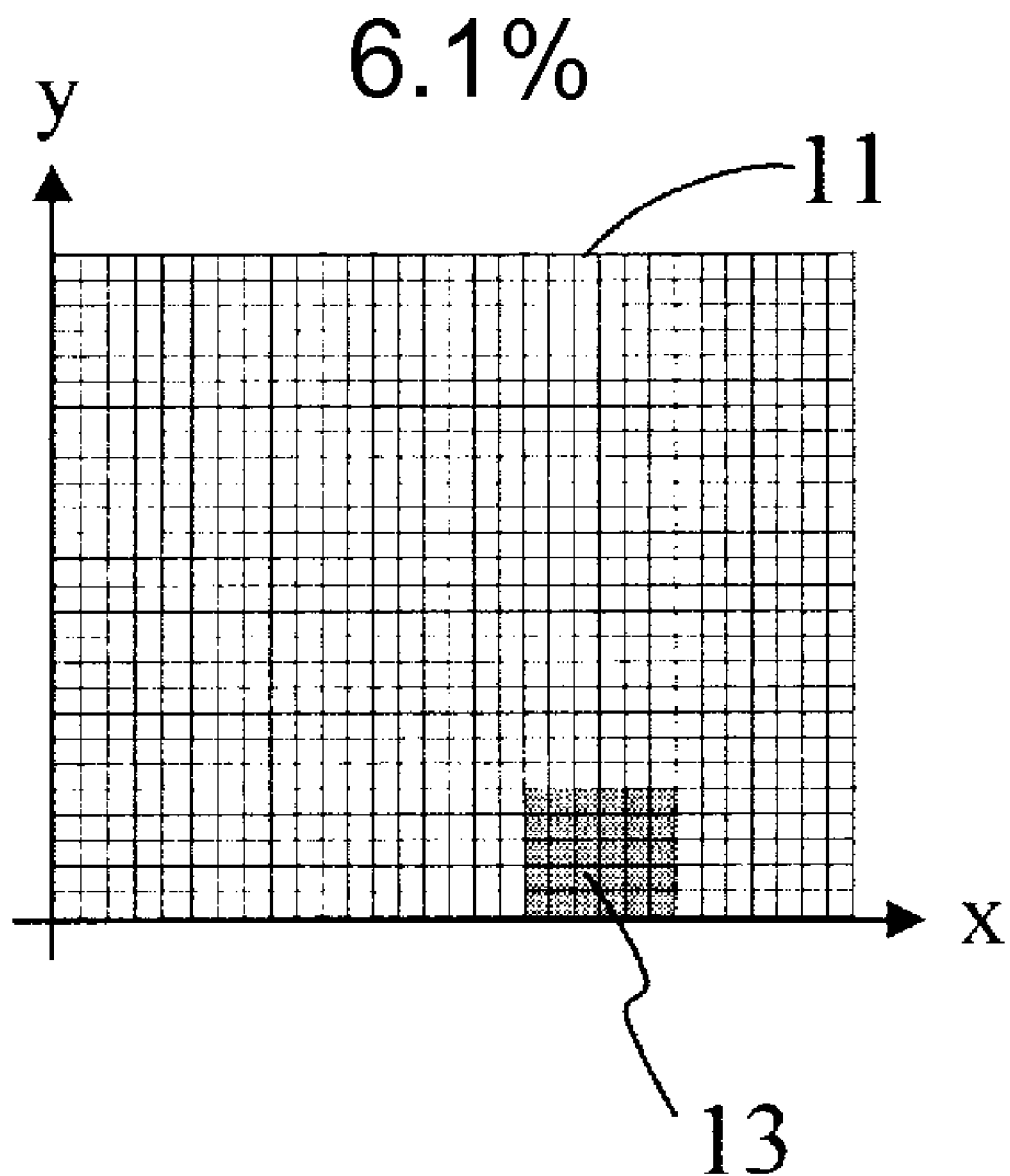

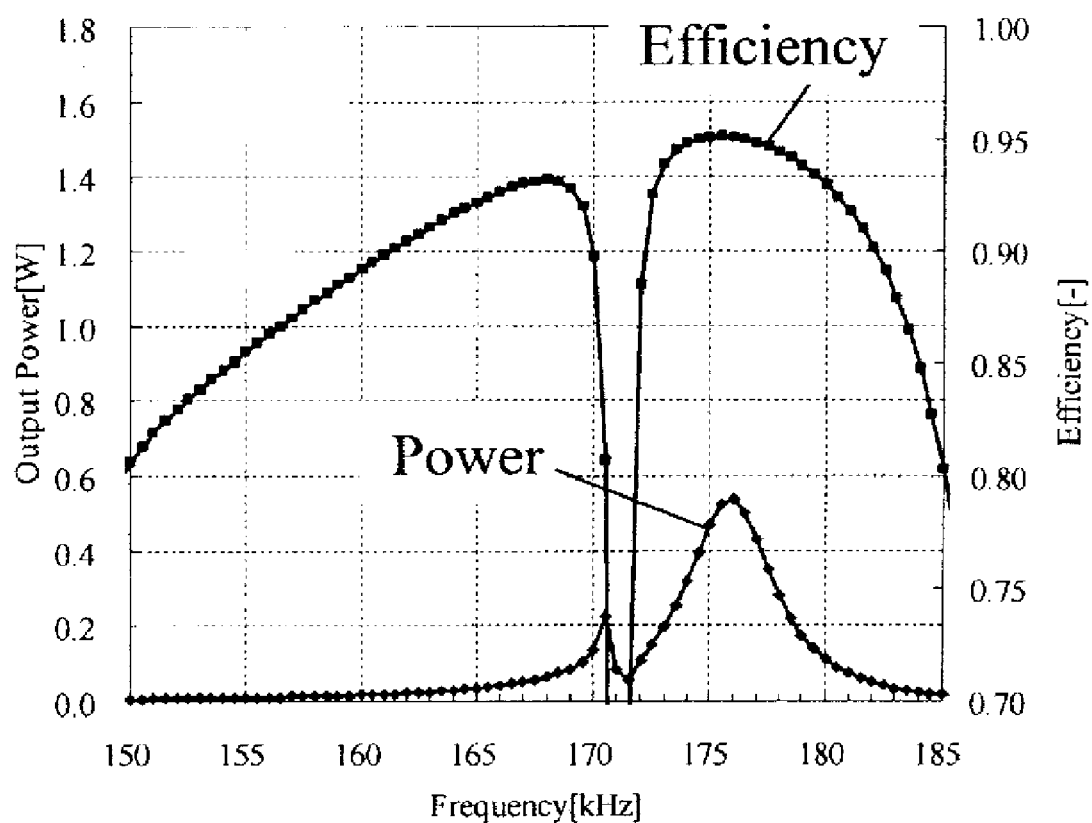
Figure 13A2

Figure 13B1
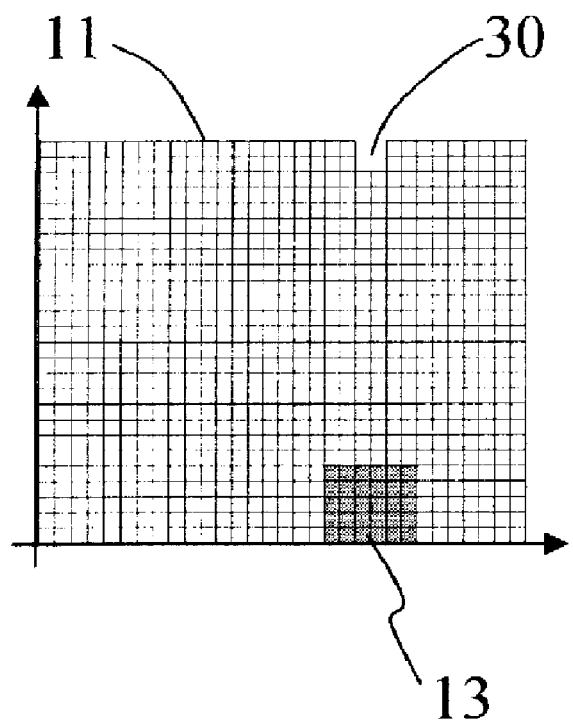

Figure 13B2
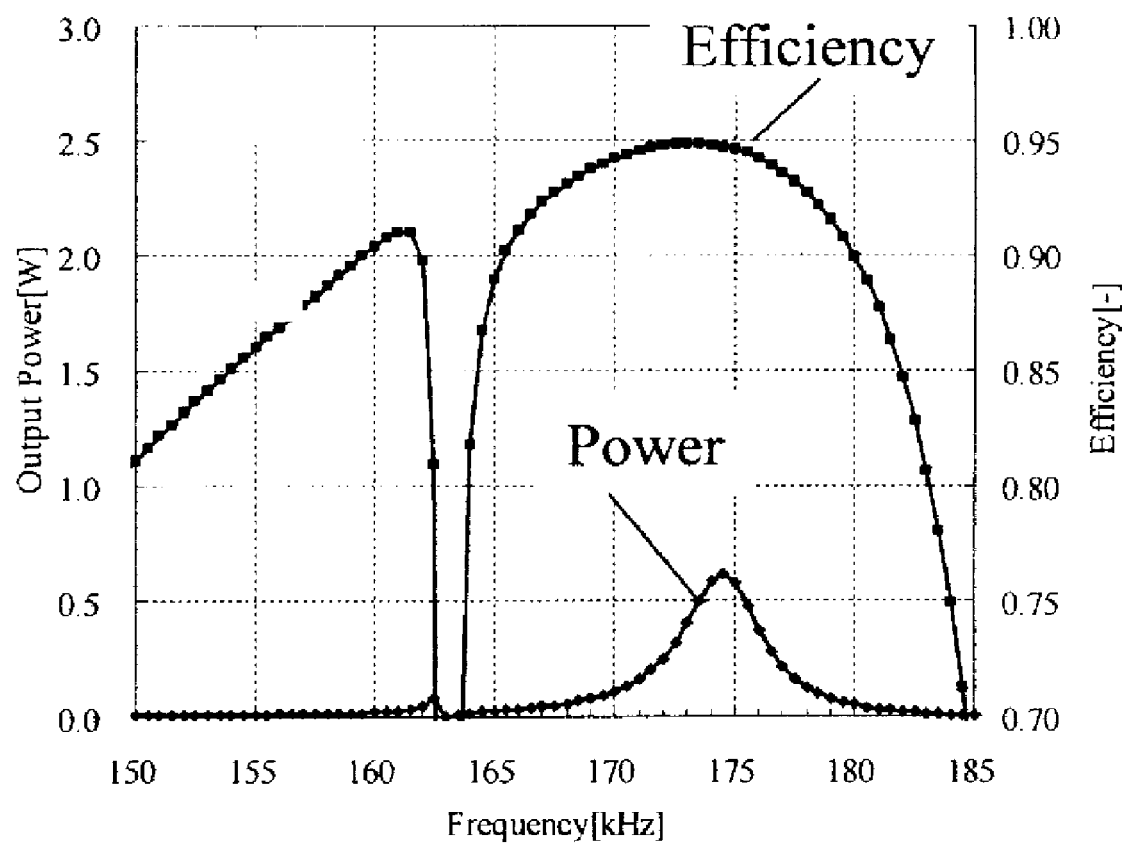

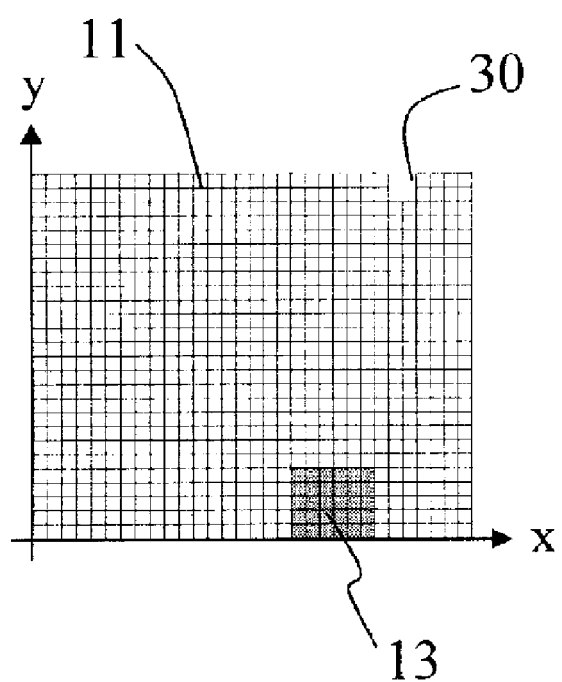
Figure 13C1

Figure 13C2
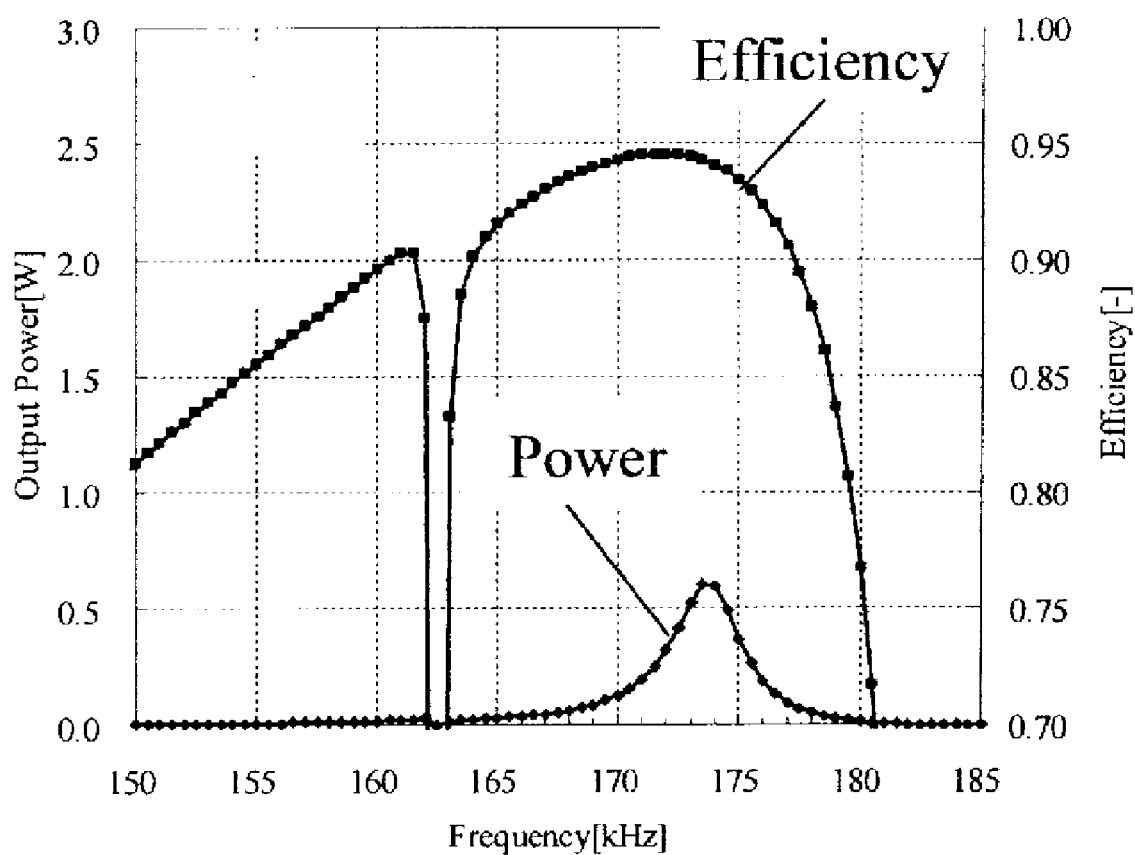

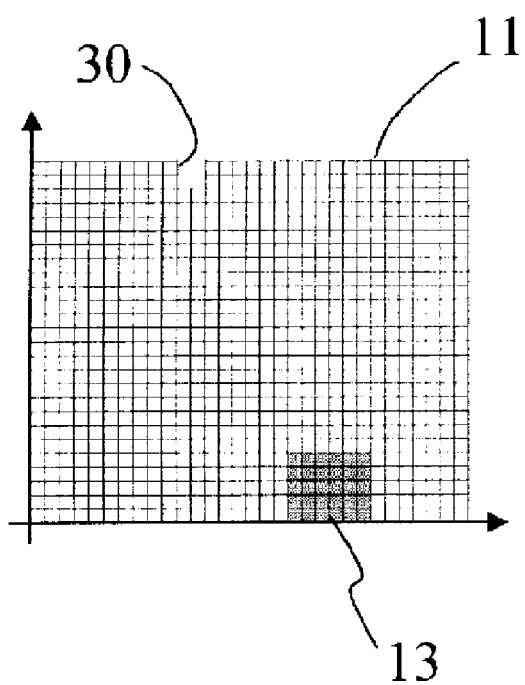
Figure 13D1

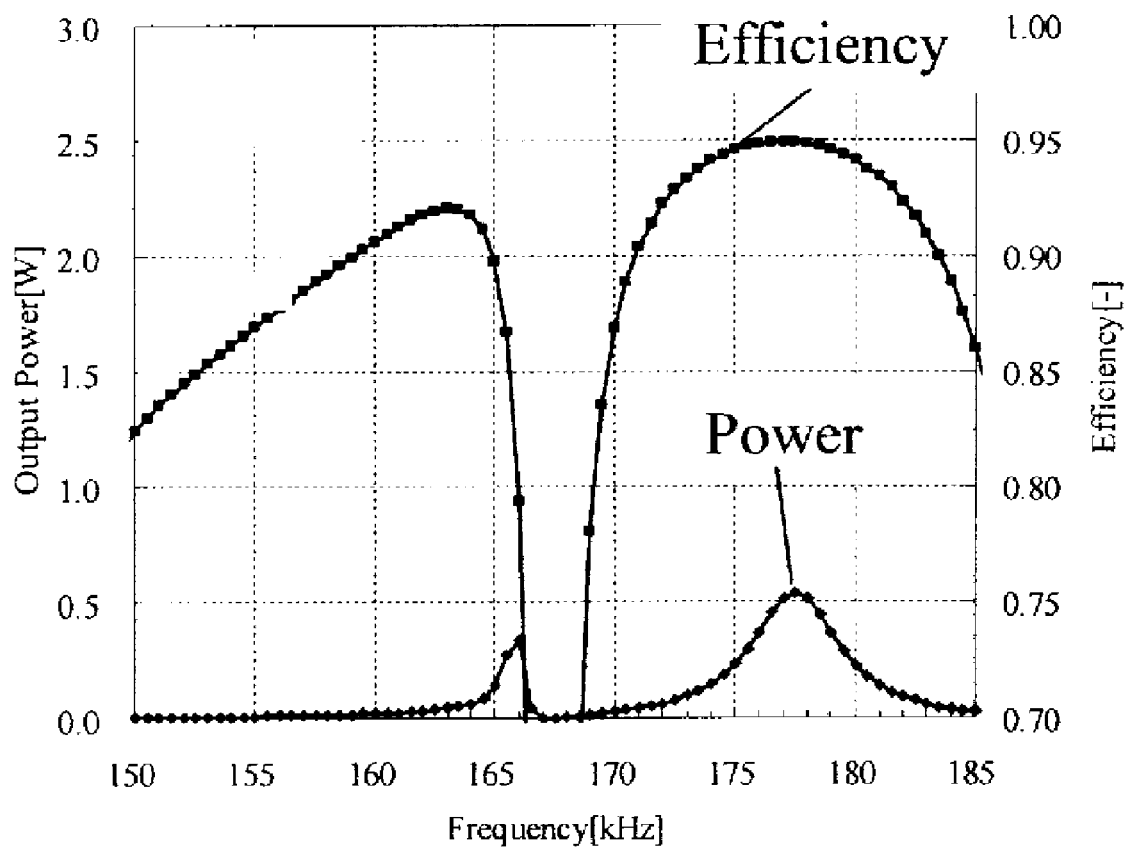
Figure 13D2

Figure 13E1
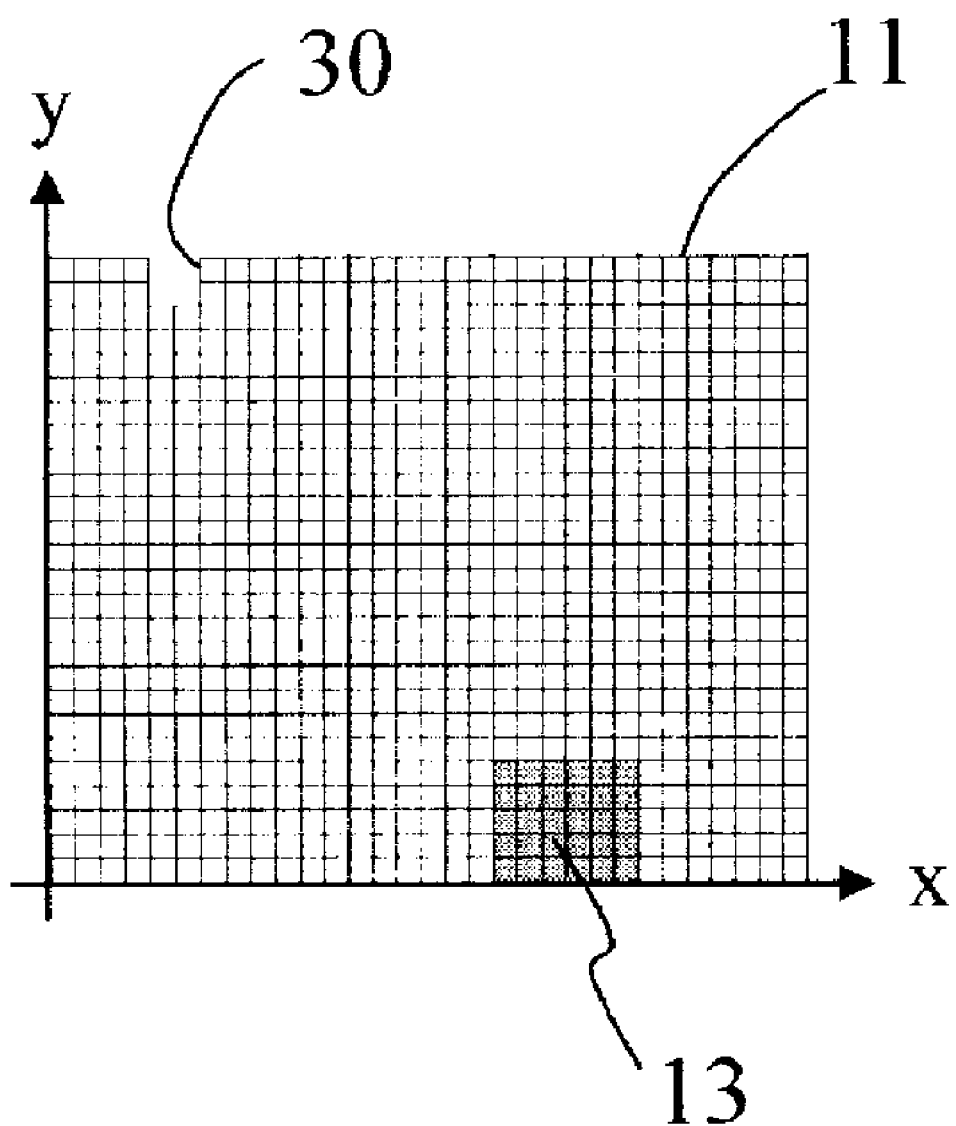

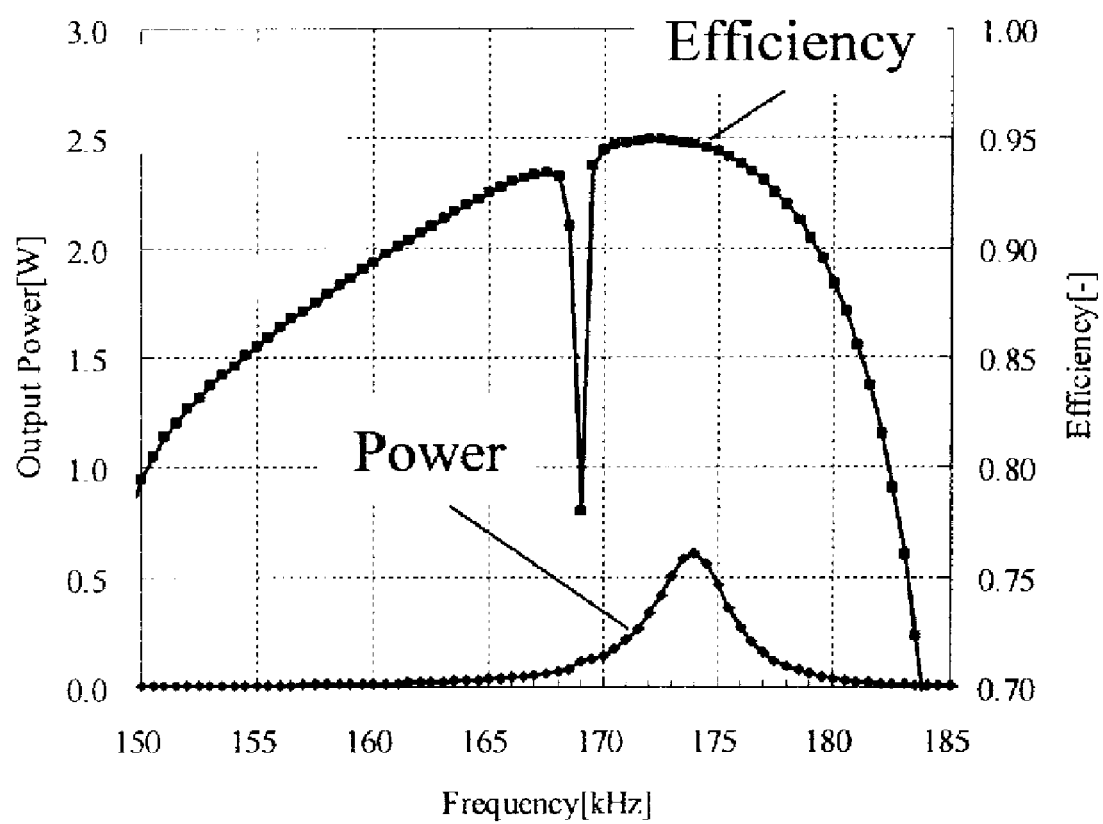
Figure 13E2

Figure 13F1
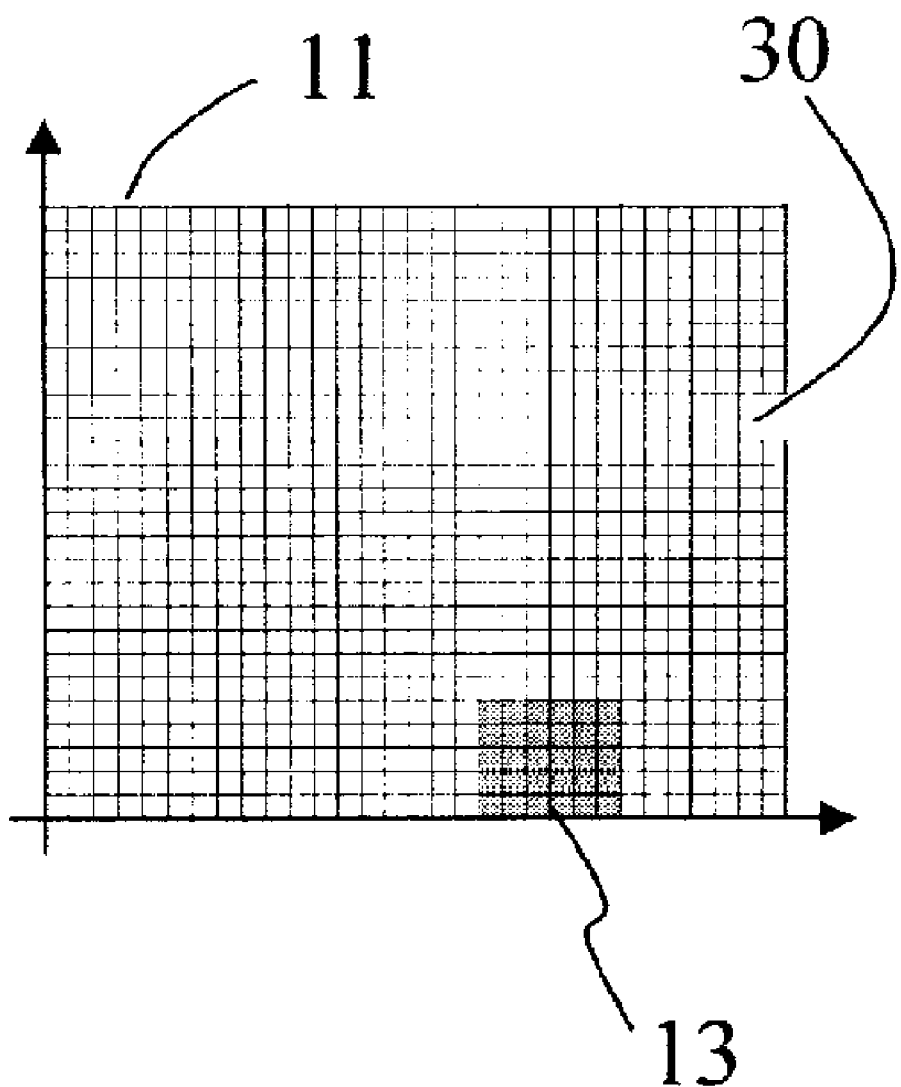

Figure 13F2
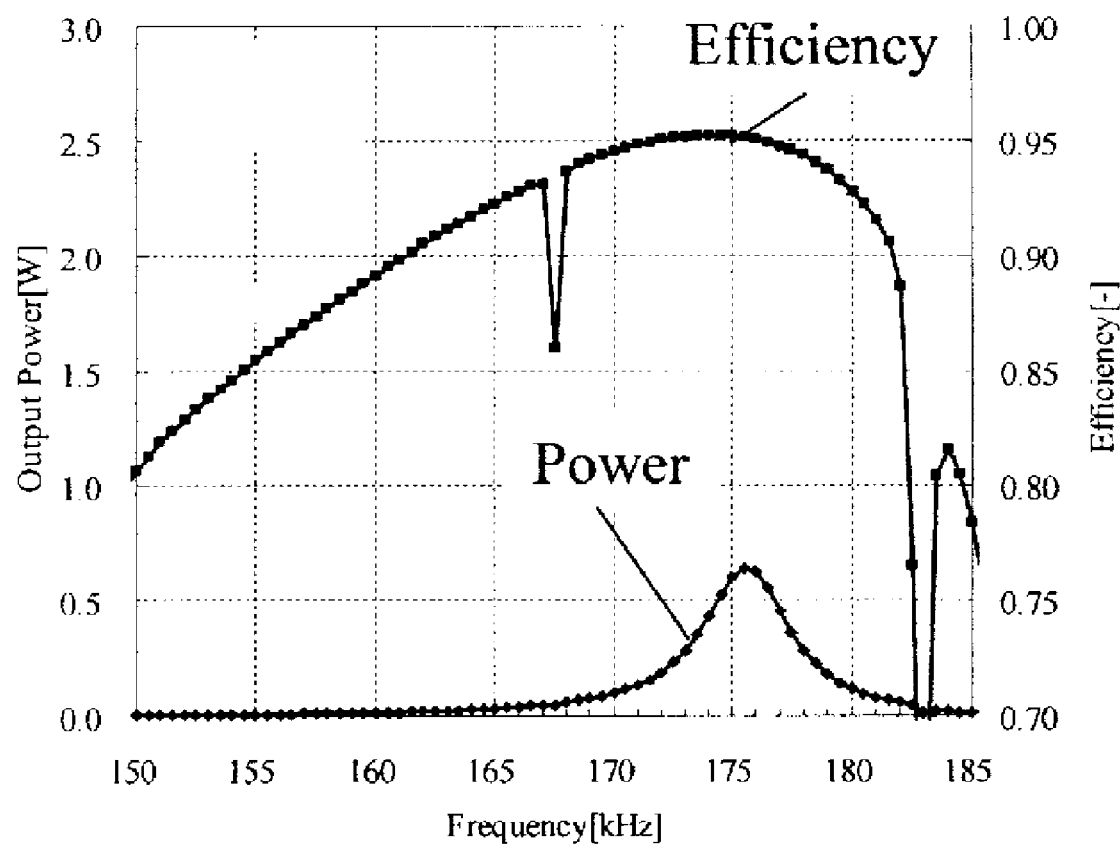

IMPEDANCE MATCHING PIEZOELECTRIC TRANSFORMER

CROSS REFERENCE TO RELATED APPLICATIONS

This application is the U.S. National Stage application of PCT application PCT/JP2008/063536 filed on Jul. 28, 2008, which claims priority under 35 U.S.C. §119 to Japanese Patent Application No. 2007-196079 filed on Jul. 27, 2007, and the contents of each of these applications are incorporated herein by reference in their entirety.

FIELD OF THE INVENTION

The present invention relates to a piezoelectric transformer. More particularly, the present invention relates to a piezoelectric transformer for AC adapter and DC to DC converter used in various electronic devices, and an inverter for a backlight cold cathode fluorescent lamp of a liquid crystal display used in laptops, handheld devices and the like.

BACKGROUND

A conventional switched-mode power supply uses as a transformer an electromagnetic transformer which operates based on electromagnetic induction as its operation principle. The electromagnetic transformer has a problem under high frequencies that hysteresis loss, eddy-current loss and loss caused by skin effect are increased. Moreover, reduction in size and thickness of the electromagnetic transformer itself leads to copper loss caused by winding an ultra-fine wire a number of times, reduces magnetic coupling, and increases leakage flux. All of those may result in large decrease in the efficiency of a power supply circuit. Furthermore, the electromagnetic transformer has a problem of generation of electromagnetic noises from windings.

Therefore, piezoelectric transformers have been developed in recent years. As such a piezoelectric transformer, one is known in which an input part, an output part, and another input part are arranged in that order in the lengthwise direction of a piezoelectric substrate in which both main surfaces are rectangular; a pair of internal electrode layers for the input part are provided within the piezoelectric substrate in the input part with a predetermined interval in the thickness direction; and three or more internal electrode layers for the output part are provided within the piezoelectric substrate in the output part with a predetermined interval in the thickness direction (see Patent Documents 1 and 2).
Patent Document 1: JP-A-2001-185775
Patent Document 2: JP-A-2002-289937

SUMMARY

In the piezoelectric transformer described in Patent Documents 1 and 2, however, on both main surfaces of the piezoelectric substrate in the input part, a pair of input electrodes are provided each of which is formed by a whole-surface electrode having approximately the same area as that of the main surface of the piezoelectric substrate in the input part, and the capacitance in the input part is large. Thus, there is a problem that it is difficult to achieve impedance matching with a driver circuit which is to be connected to the input end of the piezoelectric transformer.

The object of the present invention is to provide a piezoelectric transformer which can reduce the capacitance in the input part and can achieve impedance matching with the input driver circuit.

A piezoelectric transformer according to the present invention has a piezoelectric substrate in which both main surfaces are rectangular and input electrodes and output electrodes which are formed on both the main surfaces of the piezoelectric substrate. The piezoelectric transformer includes an output part and a first input part and a second input part on both sides of the output part. The output part includes the output electrodes formed on central portions of both the main surfaces of the piezoelectric substrate in a lengthwise direction thereof. The first input part and the second input part include the input electrodes formed on both the main surfaces of the piezoelectric substrate in both end portions in the lengthwise direction thereof, respectively. The input electrodes of each of the first input part and the second input part are formed on both the main surfaces of the piezoelectric substrate to oppose each other. At least one of the input electrodes opposing each other is a partial electrode having an area smaller than an area of the main surface of the piezoelectric substrate in the first input part and the second input part.

In particular, in the piezoelectric transformer of the present invention, it is preferable that at least one of the input electrodes opposing each other be a partial electrode arranged in a central portion of the main surface of the piezoelectric substrate in the first input part and the second input part.

In such a piezoelectric transformer, at least one of a pair of opposing input electrodes is a partial electrode provided on the central portion of the main surface of the piezoelectric substrate in the input part, in which large strain occurs. Thus, it is possible to reduce the capacitance formed between the input electrodes of the input part without largely reducing the efficiency. Moreover, the capacitance formed between the input electrodes of the input part can be controlled by the area of the partial electrode provided on the central portion of the main surface of the piezoelectric substrate in the input part, and it is possible to achieve matching with driver circuits having various impedances.

More specifically, the central portions of the main surface of the piezoelectric substrate in the first and second input parts are portions in which large strain occurs, and the input electrode formed by the partial electrode is provided in such a portion. Therefore, the capacitance can be reduced without largely reducing the efficiency. Moreover, by adjusting the area of the input electrode within the portion in which large strain occurs, it is possible to adjust the capacitance between the input electrodes without largely reducing the efficiency and is also possible to achieve matching with driver circuits having various impedances.

It is preferable that a plurality of output electrodes be formed within the piezoelectric substrate in the output part with a predetermined interval in the thickness direction. In such a piezoelectric transformer, a step-up ratio can be controlled.

It is preferable that both the input electrodes opposing each other be the aforementioned partial electrodes. In such a piezoelectric transformer, since the partial electrodes are formed on both the main surfaces of the piezoelectric substrate, it is possible to form the partial electrodes having the same shape, thereby suppressing generation of unnecessary vibration such as bending vibration caused by asymmetry of the electrodes on both the main surfaces of the piezoelectric substrate. Due to this, a piezoelectric transformer can be obtained which is less likely to be affected by spurious vibration caused by unnecessary vibration. Moreover, from the standpoint of easy manufacturing, one of the input electrodes may be a whole-surface electrode.

It is preferable in the piezoelectric transformer of the present invention that a notch be formed on the periphery of the rectangular piezoelectric substrate. In such a piezoelectric transformer, the frequency of an unnecessary vibration mode generated around the frequency used as the piezoelectric transformer can be shifted toward the lower frequency side or the higher frequency side. Thus, it is possible to increase the frequency band width which can be used as the transformer. Also, reduction in the efficiency caused by the unnecessary vibration can be suppressed.

It is preferable that at least one of the input electrodes opposing each other include a center electrode arranged in the central portion of the main surface of the piezoelectric substrate in the first input part and the second input part and an end electrode arranged at an end of the main surface. In such a piezoelectric transformer, the capacitance can be increased. However, since the end electrode is provided at the end of the piezoelectric substrate at which vibration strain is large, the efficiency can be further improved as compared with a case where the electrode is arranged only in the central portion.

It is preferable that the center electrode and the end electrode be connected to each other by an electrode material. In such a piezoelectric transformer, the center electrode and the end electrode are electrically connected to each other, and it is unnecessary to input a power to the center electrode and the end electrode separately.

It is preferable that both end portions in the widthwise direction of the main surface of the piezoelectric substrate in the first input part and the second input part and a central portion in the widthwise direction of the output electrode in the output part be holding portions for fixing the piezoelectric transformer to another member. In such a piezoelectric transformer, it is possible to prevent the vibration used as the piezoelectric transformer from being disturbed. Therefore, degradation of the efficiency can be made small, and the piezoelectric transformer can be supported and fixed onto a substrate such as a chassis.

It is preferable that an electrode be formed in the holding portion in the first input part and the second input part and the input electrode be arranged to extend to the holding portion. In such a piezoelectric transformer, a power can be input via the holding portion.

A piezoelectric transformer device according to the present invention includes a plurality of piezoelectric transformers described above. The input electrodes in the first input parts and the second input parts of the plurality of piezoelectric transformers are connected in series, and the output electrodes in the output parts of the plurality of piezoelectric transformers are drawn out in parallel. In such a piezoelectric transformer device, it is possible to connect the input electrodes in series to reduce the capacitance between the input electrodes without largely reducing the efficiency, thereby achieving matching with driver circuits having various impedances. Moreover, since the outputs are obtained from the plurality of piezoelectric transformers, a power which cannot be obtained by a single piezoelectric transformer can be obtained.

According to the piezoelectric transformer of the present invention, at least one of the upper and lower input electrodes is formed by a partial electrode provided in a portion where large strain is generated, e.g., in the central portion of the main surface of the piezoelectric substrate in the input part. Therefore, the capacitance formed between the input electrodes in the input part can be reduced without largely reducing the efficiency. Also, it is possible to control the capacitance formed between the input electrodes of the input part by changing the area of the input electrode within a portion which does not largely reduce the efficiency.

The piezoelectric transformer device according to the present invention includes a plurality of piezoelectric transformers. The input electrodes in the first input parts and the second input parts of the plurality of piezoelectric transformers are connected in series, while the output electrodes in the output parts of the plurality of piezoelectric transformers are drawn out in parallel. Therefore, it is possible to connect the input electrodes in series to reduce the capacitance between the input electrodes without largely reducing the efficiency, and is also possible to achieve matching with driver circuits having various impedances. Moreover, since outputs are obtained from a plurality of piezoelectric transformers, a high power which cannot be obtained by a single piezoelectric transformer can be obtained.

BRIEF DESCRIPTION OF THE DRAWINGS

FIGS. 13a to 13f are analysis model diagrams in which a notch is formed on the periphery of the piezoelectric substrate with a partial electrode formed thereon, and graphs showing the analysis results.

DETAILED DESCRIPTION

Figure 1:
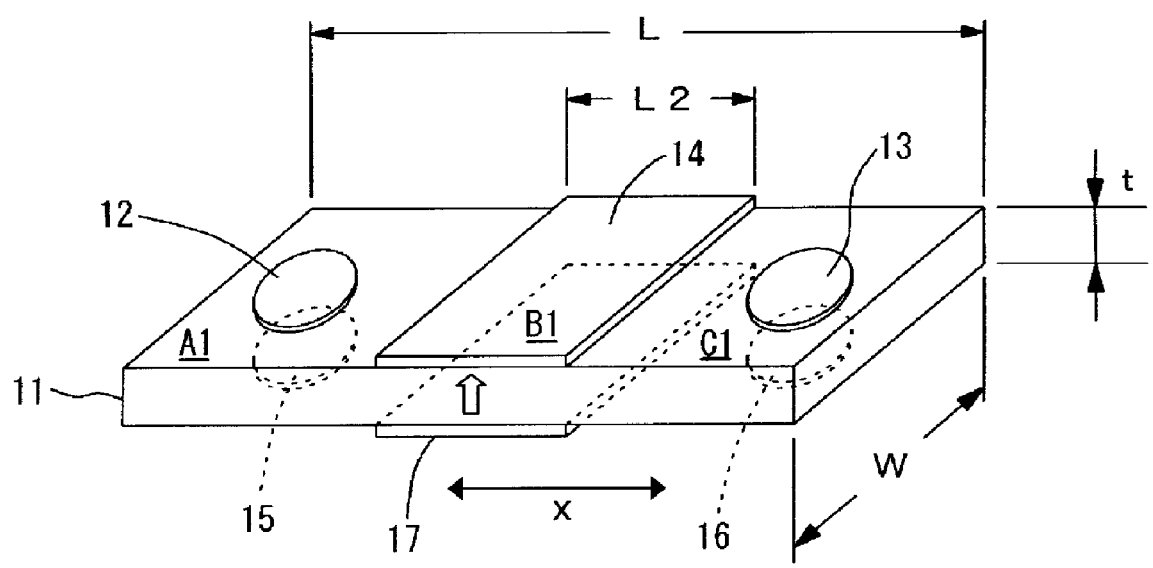
FIG. 1 is a perspective view showing an embodiment of a single-layer piezoelectric transformer according to the present invention.

A single-layer piezoelectric transformer according to the present invention includes a first input part A1, an output part B1, and a second input part C1 in that order in the lengthwise direction x of a piezoelectric substrate 11, as shown in FIG. 1. The main surfaces of the piezoelectric substrate 11 are rectangular and have the length of L and the width of W.

An input electrode 12, an output electrode 14, and an input electrode 13 are formed on the upper main surface of the piezoelectric substrate 11 in the first input part A1, the output part B1, and the second input part C1, respectively. The electrodes 12, 13 and 14 are formed with a predetermined interval in the lengthwise direction of the piezoelectric substrate 11.

An input electrode 15, an output electrode 17, and an input electrode 16 are formed on the lower main surface of the piezoelectric substrate 11 with a predetermined interval in the lengthwise direction of the piezoelectric substrate 11.

The output part B1 is formed by the output electrodes 14 and 17 and a portion of the piezoelectric substrate 11 between the output electrodes 14 and 17. The input parts A1 and C1 are portions on both sides of the output part B1.

The first input part A1 is formed by a pair of opposing input electrodes 12 and 15 on both the main surfaces of the left portion of the piezoelectric substrate 11. The output part B1 is formed by a pair of opposing output electrodes 14 and 17 on both the main surfaces of the central portion of the piezoelectric substrate 11. The second input part C1 is formed by a pair of opposing input electrodes 13 and 16 on both the main surfaces of the right portion of the piezoelectric substrate 11. The electrodes 14 and 17 each has a side having the same length as the width W of the main surfaces of the piezoelectric substrate 11 and another side having a length of L2 in the lengthwise direction of the main surfaces. The output electrodes 14 and 17 are rectangular whole-surface electrodes.

According to the present invention, the input electrodes 12 and 15 are partial electrodes provided on the main surfaces of the piezoelectric substrate in the central portion of the first input part A1, and the input electrodes 13 and 16 are partial electrodes provided on the main surfaces of the piezoelectric substrate in the central portion of the second input part C1. The input electrodes 12 and 15 each has an area smaller than the area of the main surface of the piezoelectric substrate 11 in the first input part A1, and the input electrodes 13 and 16 each has an area smaller than the area of the main surface of the piezoelectric substrate in the second input part C1.

In a conventional case where both the input electrode and the output electrode were whole-surface electrodes, a certain gap was formed for preventing electrical conduction between the input and output electrodes; a portion other than the output part and the gap was defined as the input part; and the input electrode was formed on the whole surface of the main surface of the piezoelectric substrate in that input part. On the other hand, according to the present invention, the portions on both sides of the output part B1 are defined as the input parts A1 and C1, and the input electrodes 12, 15, 13, and 16 are formed on portions of the main surfaces in the input parts A1 and C1. It is desirable that the input electrode 12, 15, 13, and 16 have an area equal to or less than 60% of the area of the main surface of the piezoelectric substrate in the input part A1 and C1 (the area of the main surface in the input part A1 and that in the input part C1 are the same). The electrostatic capacitance in the input part of the piezoelectric transformer is determined so as to achieve matching with a driver circuit for the piezoelectric transformer, and then the area ratio of the input electrode 12, 15, 13, and 16 to the main surface of the piezoelectric substrate in the input part A1 and C1 is determined from the thus determined capacitance.

Figure 2:
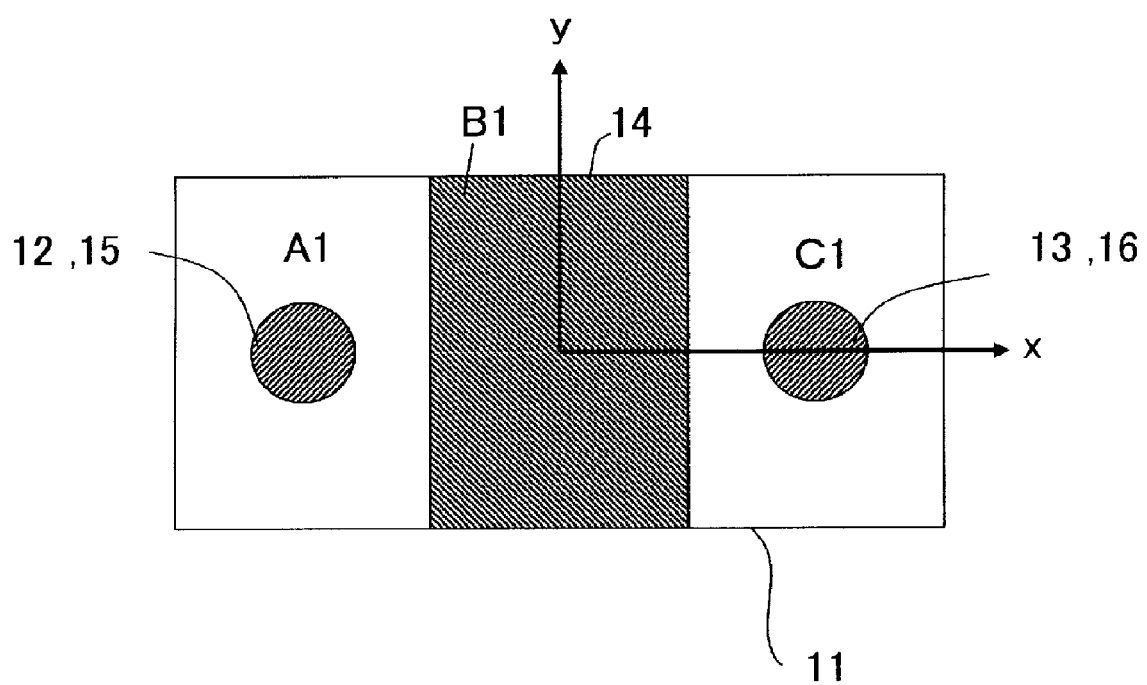
FIG. 2 is a plan view showing the electrode shape in the piezoelectric transformer according to the present invention.

In the piezoelectric transformer according to the present invention, vibration occurs to cause large strain in the central portions of the main surfaces of the piezoelectric substrate 11 in the input parts A1 and C1. As shown in FIG. 2, circular input electrodes 12, 15, 13, and 16 are provided in the portions in which that large strain is generated. The input electrodes 12 and 15 have the same shape and the same dimensions, and overlap with each other when viewed from above the piezoelectric substrate 11. The same can be applied to the input electrodes 13 and 16.

The piezoelectric substrate 11 has a portion in which positive strain (strain in the tensile direction) occurs and a portion in which negative strain (strain in the compressive direction) occurs. From the standpoint of improving the efficiency, it is desirable for the dimensions of the input electrodes 12, 15, 13, and 16 to be determined so that the input electrodes 12, 15, 13, and 16 are formed only in the portions in which large strain with the same sign, e.g., the positive strain (strain in the tensile direction) occurs. Therefore, the shapes of the input electrodes may be elliptical although the circular shape has been described. Moreover, the shapes of the input electrodes may be quadrangular.

More specifically, in order to achieve impedance matching with a driver circuit, it is generally necessary to adjust the impedance determined by the electrostatic capacitance on the input side of a piezoelectric transformer. However, there are various types of driver circuits. For achieving impedance matching with those driver circuits, it is desirable that the electrostatic capacitance on the input side of the piezoelectric transformer can be controlled.

In a case where the capacitance on the input side of the piezoelectric transformer is to be increased for achieving the impedance matching, the capacitance can be increased by employing the structure in which input piezoelectric ceramics are stacked in the thickness direction.

Conventionally, from the standpoint of improving the efficiency, there was only an idea of forming a pair of input electrodes by whole-surface electrodes on both the main surfaces of the piezoelectric substrate in the input part, as described in Patent Documents 1 and 2. In that idea, the capacitance in the input part was large and constant and it was therefore difficult to achieve impedance matching with a driver circuit connected to the input end of the piezoelectric transformer.

Figure 11:
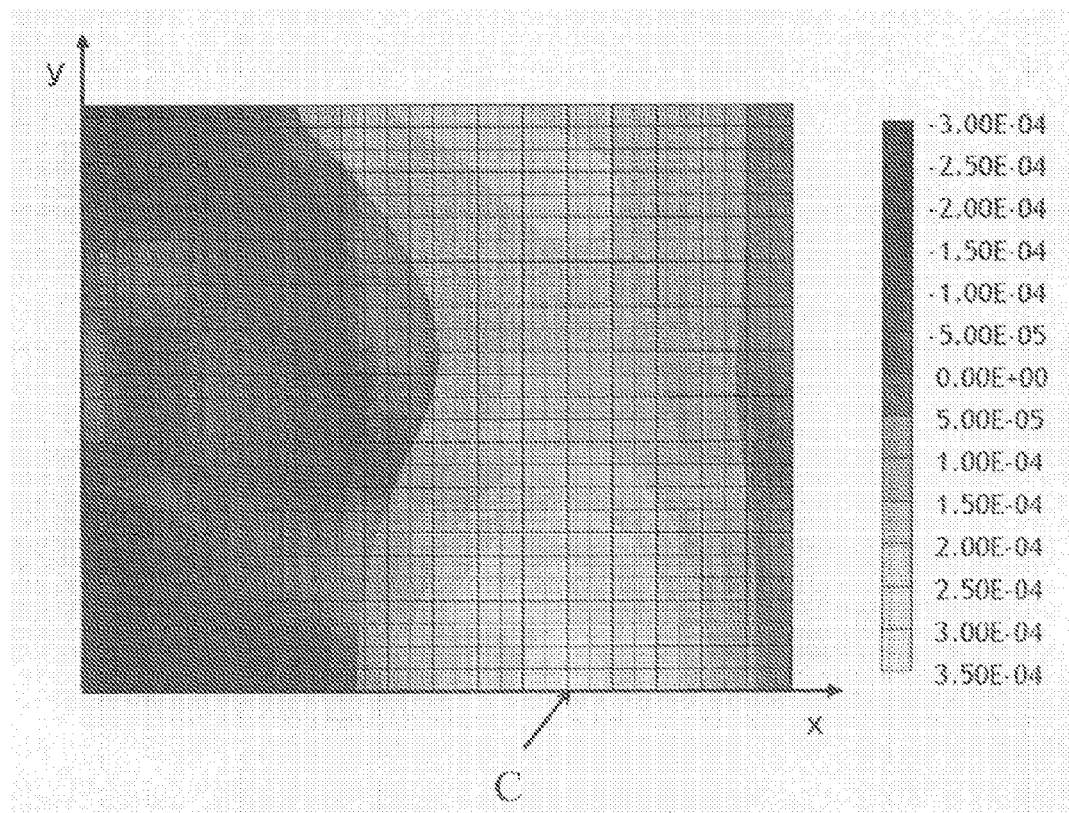
FIG. 11 shows distribution of strain $S_{xx}$ obtained by computer simulation on a piezoelectric transformer in which an input part is a whole-surface electrode.

On the other hand, according to the present invention, as shown in FIG. 11 which is a quarter-symmetry model diagram, the central portion C of the main surface of the piezoelectric substrate in the input part is a portion in which large strain occurs. Therefore, the input electrode 12, 15, 13, and 16 formed by a partial electrode is provided in that portion. Due to this, the capacitance can be reduced without largely reducing the efficiency. Moreover, by adjusting the area of the input electrode 12, 15, 13, and 16 within the portion in which large strain occurs, matching with driver circuits having various impedances can be achieved without largely reducing the efficiency. Please note that in FIG. 11 "E-04" means×10$^{-4}$, for example. The same description is also applied to FIG. 12.

In the piezoelectric transformer according to the present invention, the ratio (L/W) of the length L of the main surface of the piezoelectric substrate 11 to the width W thereof is set to be in a range from 1.1 to 1.4 and the product (F×L) of the length L of the main surface of the piezoelectric substrate 11 and the driving frequency F is set to be in a range from 4700 to 6000 kHz·mm. By setting the ratio (L/W) of the length L of the main surface of the piezoelectric substrate 11 to the width W thereof to be in a range from 1.1 to 1.4, high energy conversion efficiency can be obtained.

Figure 3:
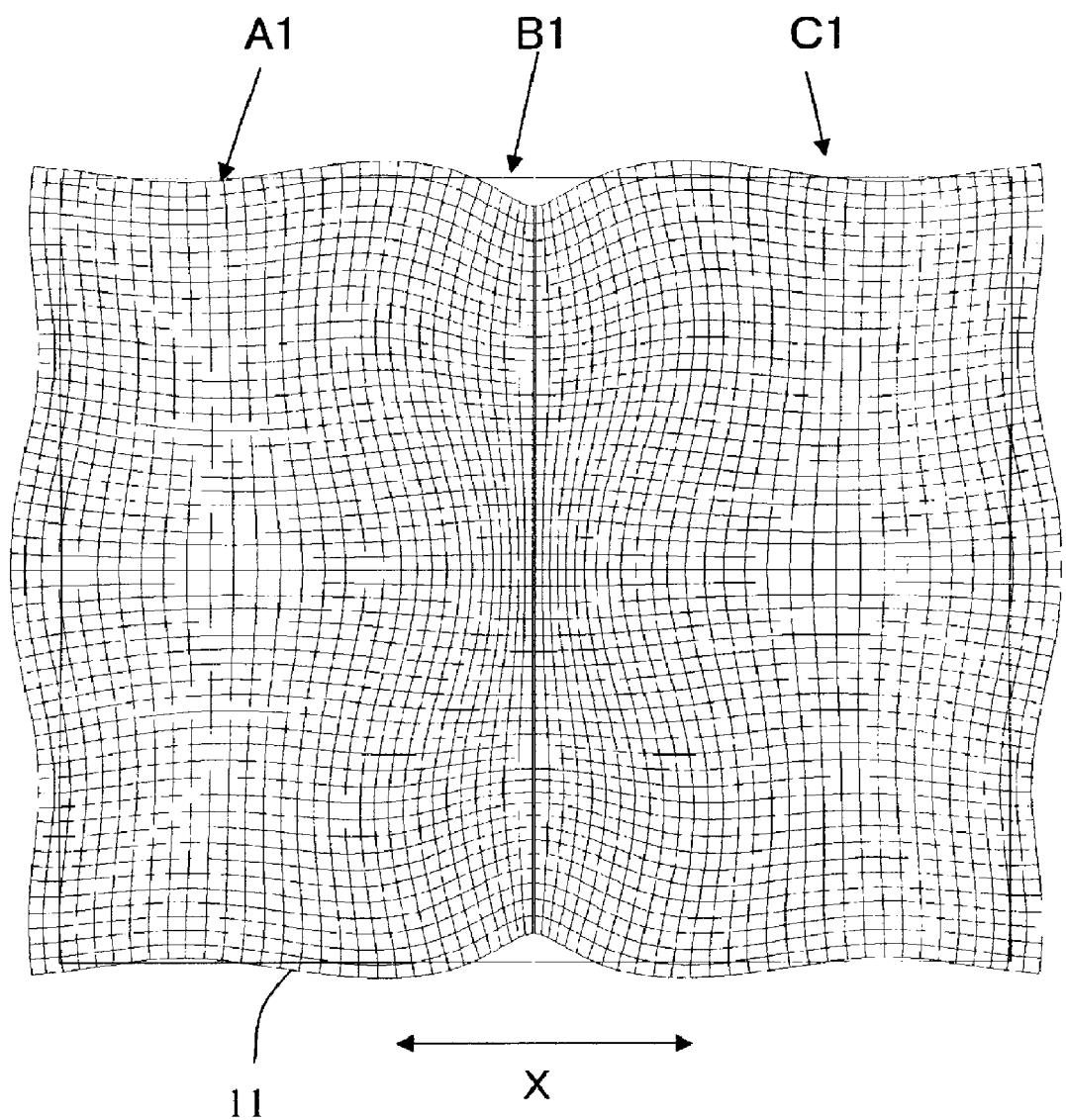
FIG. 3 is a diagram showing a vibration mode of the piezoelectric transformer according to the present invention.

According to the present invention, the ratio (L/W) of the length L of the main surface of the piezoelectric substrate 11 to the width W thereof is set to be in a range from 1.1 to 1.4, and the product (F×L) of the length L of the main surface of the piezoelectric substrate 11 and the driving frequency F is set to be in a range from 4700 to 6000 kHz·mm. Due to this, the fundamental wave which oscillates in the lengthwise direction x of the piezoelectric substrate 11 has a main role as shown in FIG. 3, but coupled-mode vibration in which vibration in the widthwise direction is added occurs in the piezoelectric substrate 11. Thus, the greatest vibration can be generated in the output part B1 formed in the central portion, and, as compared with a case of using vibration which is most excited in the widthwise direction, the amount of electric charges induced in the output part can be increased and a higher output power can be obtained.

The product (F×L) of the length L of the main surface of the piezoelectric substrate 11 and the driving frequency F is set to be in a range from 4700 to 6000 kHz·mm from the standpoint that a high output power can be obtained. Therefore, in order to achieve a high output power and a high efficiency, L/W is set to be in a range from 1.1 to 1.4 and F×L is set to be in a range from 4700 to 6000 kHz·mm.

Therefore, according to the present invention, by setting the product (F×L) of the driving frequency F and the length L of the main surface to be a predetermined range in the above-described structure, a piezoelectric transformer with a high output power and a high efficiency can be obtained which has a high energy conversion efficiency and can be used at a high input voltage.

The inventors of the present invention performed vibration analysis on the piezoelectric transformer of the present invention in computer simulation using a finite element method. The analysis conditions were as follows. It was assumed that: piezoelectric material was lead zirconate titanate (hereinafter, referred to as PZT)-based material; the output electrodes were formed by whole-surface electrodes and the input electrodes were formed by partial electrodes in the shape of the piezoelectric transformer of FIG. 1; and the length L, the width W and the thickness t of the piezoelectric substrate 11 were set to 32.80 mm, 25.5 mm, and 3.0 mm, respectively. When voltages of the same amplitude and the same phase as each other were supplied to the first and second input parts, distribution of the displacement amount of the piezoelectric substrate was obtained.

FIG. 3 shows the displacement distribution of the piezoelectric transformer with the driving frequency F of 159 kHz (F×L=5215.2 kHz·mm). As shown in FIG. 3 which shows the displacement distribution, in the piezoelectric transformer of the present invention, large displacement is obtained in the output part and a high output power and a high efficiency are obtained.

More specifically, energy transfer in the piezoelectric transformer is carried out by vibration of the piezoelectric substrate 11. Therefore, when the piezoelectric substrate 11 has the same shape, the amount of electric charges induced in the output part B1 is increased as the displacement amount becomes larger at the input voltage of the same amplitude. From that reason, in the case of FIG. 3 in which the displacement amount is large in the central portion of the piezoelectric substrate 11, a high output power and a high efficiency are obtained.

For example, the piezoelectric transformer according to the present invention is obtained by forming the electrodes 12 to 17 on the piezoelectric substrate 11 made of ceramic, and then performing polarization treatment for about 30 minutes in which a direct current voltage is applied between three electrodes 12, 13, and 14 on the upper surface of the piezoelectric substrate 11 and three electrodes 15, 16, and 17 on the lower surface of the piezoelectric substrate 11 in silicone oil at 120° C.

The electrodes 12 to 17 may be formed by screen-printing paste made of Ag powder and glass and then calcining the printed paste, for example. Alternatively, the electrodes 12 to 17 may be formed by vapor deposition, sputtering or the like. Moreover, electrically-conductive material other than Ag may be used.

On the other hand, load resistance RL' which forms matching impedance is determined by $RL'=1/(2\pi FCd2)$ where the driving frequency is F and the output electrostatic capacitance is Cd2. Since the electrostatic capacitance on the output side can be easily increased in the piezoelectric transformer of the present invention, impedance matching can be achieved at a low impedance and a high output power and a high efficiency can be achieved.

Voltage conversion of a piezoelectric transformer uses mechanical vibration generated by applying an alternating-current voltage across the input electrodes, forcibly causes mechanical vibration between the output voltages, and receives an alternative-current voltage from across the output electrodes again.

In the piezoelectric transformer of the present invention, the polarization direction is formed perpendicular to the main surface of the piezoelectric substrate. The input part excites vibration within the piezoelectric transformer substrate surface and transfers the excited vibration to the output part, and the output part converts the transferred vibration into electric charges. For that reason, it is desirable that the material suitably used for the piezoelectric transformer of the present invention have a large piezoelectric coefficient $d_{31}$. For example, PZT-based piezoelectric ceramic materials are desirable as the above-described material.

When the aforementioned piezoelectric transformer is used as a transformer for a switching power supply circuit, it is possible to manufacture a circuit having the efficiency which is not reduced for a certain frequency change range. Moreover, by using those characteristics and changing an operating frequency, it is possible to manufacture a circuit which can achieve a target output power without reducing the efficiency.

Figure 4:
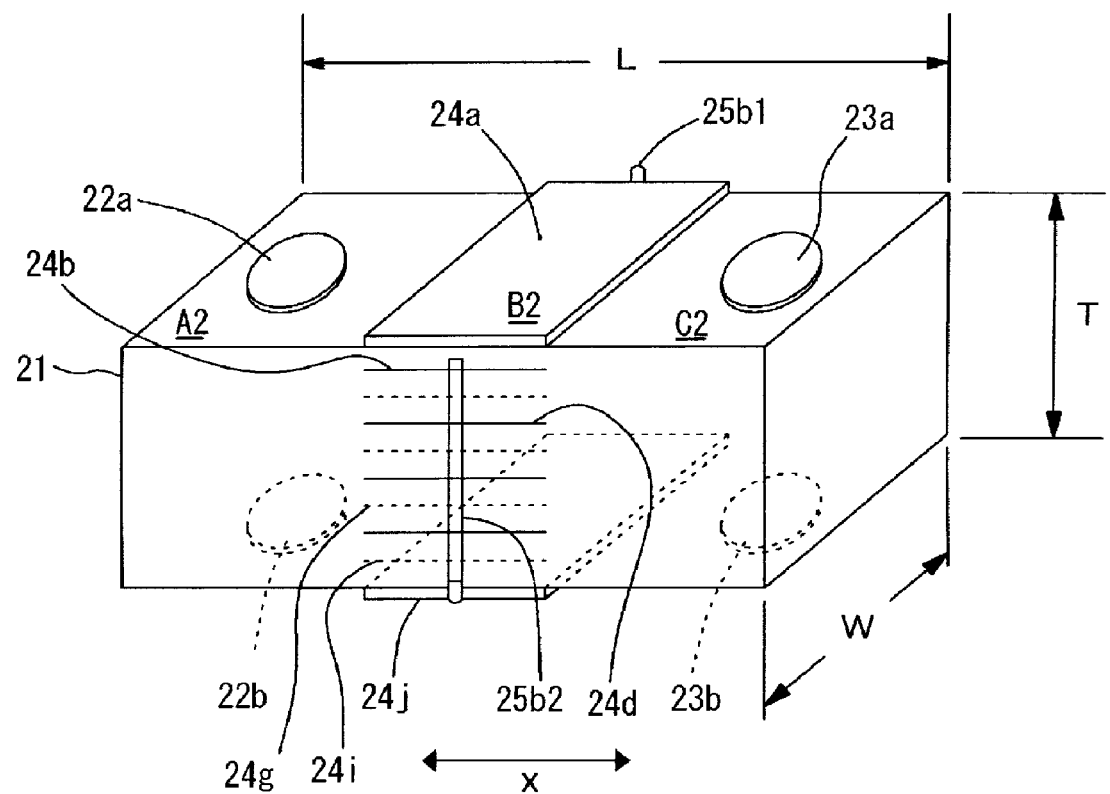
FIG. 4 is a perspective view schematically showing an embodiment of a multilayer piezoelectric transformer according to the present invention.

FIG. 4 shows a multi-layer piezoelectric transformer according to the present invention. In the multi-layer piezoelectric transformer, the first input part A2, the output part B2, and the second input part C2 are arranged on a piezoelectric substrate 21 in which the main surfaces are rectangular and have a length of L and a width of W, in that order in the lengthwise direction thereof.

An input electrode 22a, an output electrode 24a, and an input electrode 23a are formed on the upper main surface of the piezoelectric substrate 21 in the first input part A2, the output part B2, and the second input part C2, respectively.

Those electrodes 22a, 23a, and 24a are arranged with a predetermined interval in the lengthwise direction x of the piezoelectric substrate 21.

An input electrode 22b, an output electrode 24j, and an input electrode 23b are formed on the lower main surface of the piezoelectric substrate 21 with a predetermined interval in the lengthwise direction of the piezoelectric substrate 21. In this embodiment, output electrodes 24b to 24i are formed within the piezoelectric substrate 21 in the output part B2.

The input electrodes 22a and 22b have the same dimensions as each other. The output electrodes 24a to 24j have the same dimensions as one another. The input electrodes 23a and 23b have the same dimensions as each other.

Also in this embodiment, the input electrodes 22a and 22b are partial electrodes provided on the central portions of both the main surfaces of the piezoelectric substrate in the first input part A2 to oppose each other, and the input electrodes 23a and 23b are partial electrodes provided on the central portions of both the main surfaces of the piezoelectric substrate in the second input part C2 to oppose each other. In other words, the central portions of the main surface of the piezoelectric substrate in the input parts A2 and C2 are portions in which large strain occurs, and circular input electrodes 22a, 22b, 23a, and 23b formed by partial electrodes are provided on those portions. The output electrodes 24a to 24j are alternately connected by a pair of external electrodes 25b1 and 25b2.

Also in this piezoelectric transformer, the ratio (L/W) of the length L of the main surface of the piezoelectric substrate 21 to the width W thereof is in a range from 1.1 to 1.4 and the product (F×L) of the length L of the main surface of the piezoelectric substrate 21 and the driving frequency F is in a range from 4700 to 6000 kHz·mm, as in the piezoelectric transformer shown in FIG. 1.

The same effects as those in the piezoelectric transformer shown in FIG. 1 can be obtained in this multi-layer piezoelectric transformer. In addition, since the area of the output electrodes can be increased, the output power can be increased as compared with a single-layer piezoelectric transformer having the same length and the same width.

Moreover, as for load resistance RL' forming impedance matching in the multi-layer piezoelectric transformer, the output electrostatic capacitance Cd2 can be made larger as compared with that in a single-layer piezoelectric transformer. Thus, impedance matching can be achieved at lower impedance.

A voltage conversion ratio (=V2/V1) in a piezoelectric transformer is $V2/V1 \propto (Cd1/Cd2)^{1/2}$ where the input electrostatic capacitance is Cd1. Therefore, by stacking piezoelectric transformers, it is possible to control Cd1 and Cd2 and set the conversion ratio to a given value. In other words, the piezoelectric transformer of the present invention can be suitably used for a buck-boost converter or a buck-boost inverter by determining the conversion ratio to be a given value.

A manufacturing method of this multi-layer piezoelectric transformer is now described. PZT-based piezoelectric ceramic mixed in desired composition is calcined at a temperature of from 900° C. to 1100° C. The calcined powder is pulverized, and is then dispersed with binder, plasticizer and the like added thereto in organic solvent, thereby obtaining slurry. The slurry is formed into ceramic green sheets having a desired thickness by doctor blade method, for example.

Figure 5:
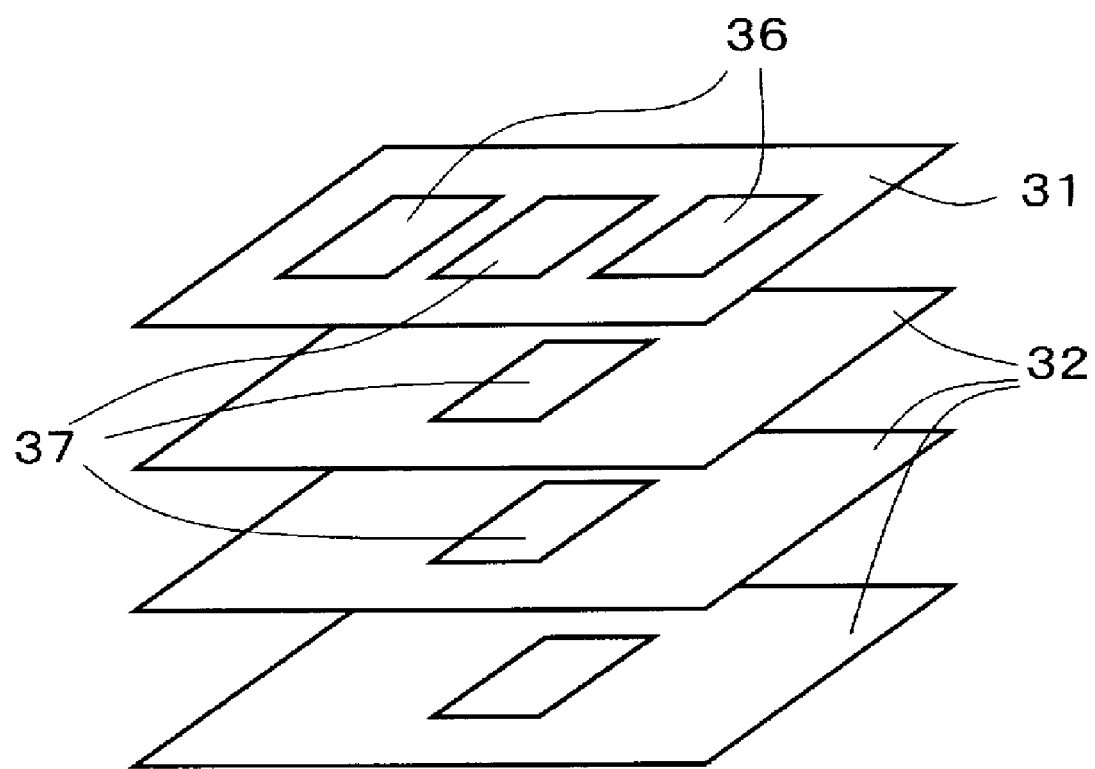
FIG. 5 is an explanation diagram for explaining a manufacturing method of the multilayer piezoelectric transformer of FIG. 4.

A highly heat resistant electrically conductive paste such as Ag—Pd paste is printed on one side of the ceramic green sheet by screen printing. In this case, as shown in FIG. 5, a green sheet 31 with a pattern 36 for input electrodes and a pattern 37 for an output electrode and a green sheet 32 with the pattern 37 for the output electrode only are manufactured. The green sheet 31 and the green sheets 32 are then stacked as shown in FIG. 5, and a green sheet with no electrode pattern is stacked as an uppermost layer. The stacked sheets are connected by hot pressing into one body. Then, degreasing is performed by heating the connected sheets at a temperature of from 400° C. to 500° C., and thereafter sintering is performed at a temperature of from 1100° C. to 1300° C. Please note that FIG. 5 only shows a part of green sheets.

Subsequently, a conductive paste containing glass which forms the input electrodes and the output electrodes is applied onto upper and lower surfaces of the sintered body, and an electrically conductive paste containing glass which forms external electrodes is applied onto both side surfaces of the sintered body. Then, a baking process is carried out, thereby obtaining a piezoelectric transformer. The output electrodes 24a to 24j are alternately connected by a pair of external electrodes 25b1 and 25b2. That is, the input electrodes and the output electrodes are configured in a similar manner to a multi-layer capacitor and a multi-layer piezoelectric actuator, and internal electrodes are alternately connected to a pair of external electrodes.

While the multi-layer body is placed in silicone oil at a temperature of 120° C., direct current voltages are applied to the input electrodes 22a, 22b, 23a, and 23b and the output electrodes 24a to 24j, respectively, thereby carrying out polarization for about 30 minutes. In this manner, a multi-layer piezoelectric transformer is obtained.

Figure 6:
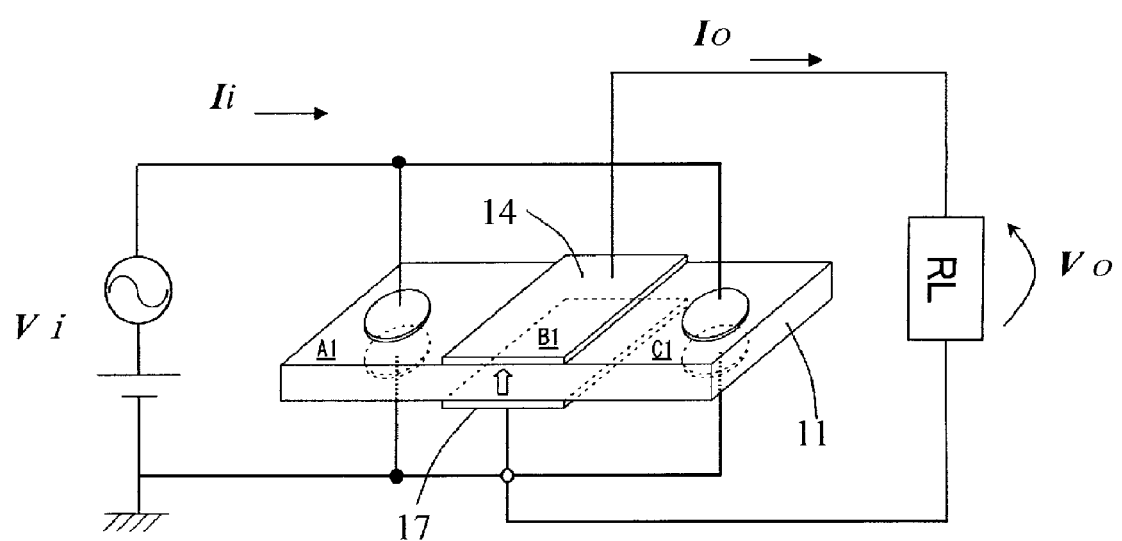
FIG. 6 is an explanation diagram showing an exemplary DC to DC converter.

Next, a power supply device is described which is formed by a DC to DC converter using the piezoelectric transformer of the present invention. The DC to DC converter includes: a switching part which converts a direct-current power-supply voltage to a high-frequency alternating-current signal and controls an input voltage to a transformer; a piezoelectric transformer which bucks and boosts the high-frequency alternating-current signal; a rectifier circuit which converts the transformed high-frequency signal into a direct-current output voltage; a voltage detector which detects the output voltage; and a controller which controls opening/closing of the switching part in accordance with the output of the voltage detector. FIG. 6 shows an example of the power supply device.

The controller changes an opening duration and/or a closed duration of the switching part, thereby changing the driving frequency F of the piezoelectric transformer so as to change the product of the length L of the main surface and the driving frequency F to be in a range from 4700 to 6000 kHz·mm. Alternatively, the controller also changes a duty ratio of the opening duration and the closed duration of the switching part with the product F×L kept in a range from 4700 to 6000 kHz·mm (4700 kHz·mm≦F×L≦6000 kHz·mm). It is desirable to employ soft switching technologies to the switching part for suppressing loss in the switch to improve the efficiency.

Figure 7A:
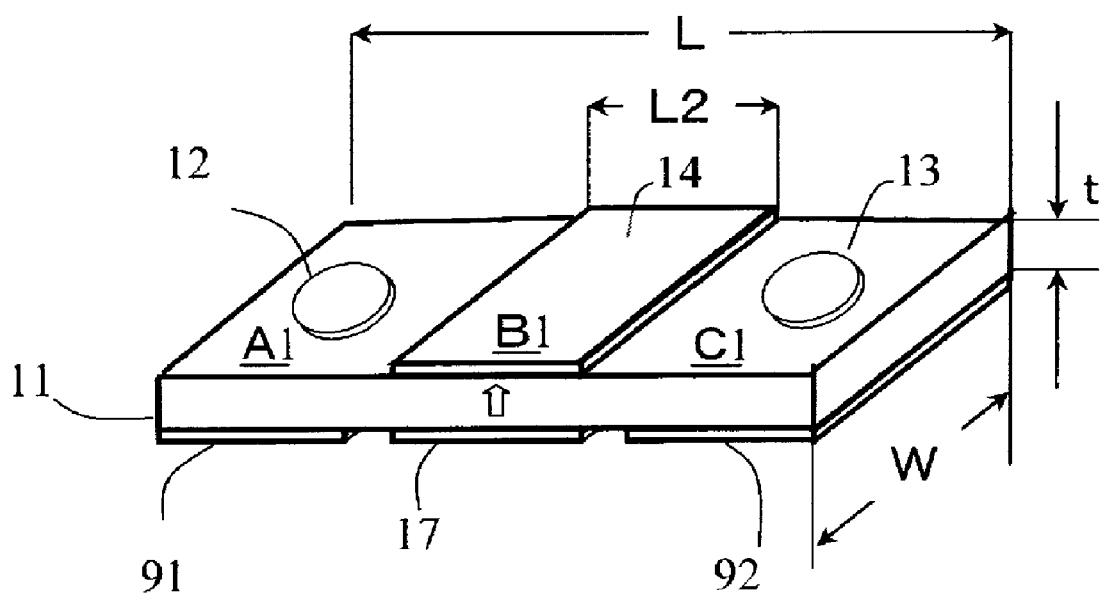
FIG. 7A and FIG. 7B are perspective views showing additional embodiments of the present invention.
Figure 7B:
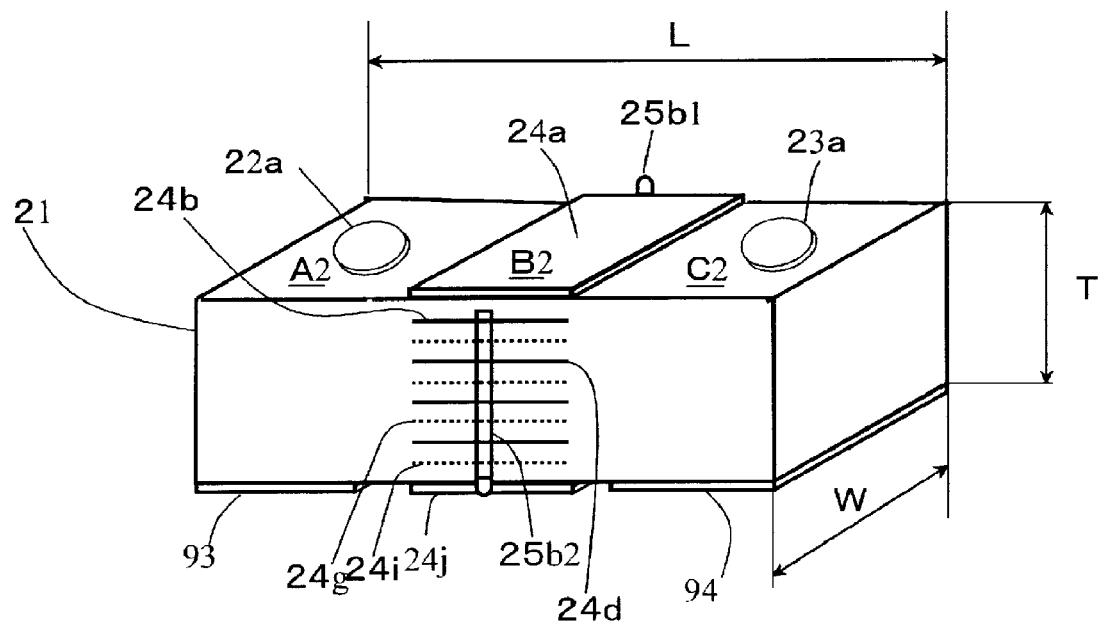

As shown in FIGS. 7(a) and 7(b), the input electrodes 12, 13, 22a, and 23a on the upper surface of the piezoelectric substrate can be made different in shape from the input electrodes 91, 92, 93, and 94 on the lower surface, thereby making the area of the upper input electrode 12, 13, 22a, and 23a smaller than the area of the lower input electrode 91, 92, 93, and 94.

In a piezoelectric transformer according to another embodiment of the present invention, a notch 30 is formed on the outer periphery of the rectangular piezoelectric substrate 11, as shown in FIGS. 13(b-1) to 13(f-1). FIGS. 13(a-1) to 13(f-1) show quarter-symmetry models in a similar manner to that in FIG. 8 described later. Analysis was performed on an upper-right portion defined by arrows in x- and y-directions in FIG. 2 as a model (quarter-symmetry model). Therefore, only a half of the partial electrode 13 is shown in this model.

By forming the notch 30 at two to eight places on the longer side or the shorter side of the rectangular piezoelectric transformer, it is possible to shift the frequency with which the efficiency is extremely reduced because of unnecessary vibration modes away from the frequency band to be used. Consequently, the frequency with which the efficiency is extremely reduced because of unnecessary vibration modes can be shifted toward the lower frequency side, and the frequency band in which the efficiency can be improved can be increased. When the notch 30 is provided, it is desirable to keep quarter-symmetry of the piezoelectric transformer element.

In FIG. 13, all the shown notches 30 are rectangular. However, the notch 30 may be semicircular or semielliptical. The forming of the notch can be carried out by using a dicing saw or a wire saw, for example.

In a piezoelectric transformer according to still another embodiment of the present invention, at least one of the input electrodes opposing each other includes: a center electrode arranged in the central portion of the main surface of the piezoelectric substrate in the first input part and the second input part; and end electrodes provided on both sides of the center electrode in the widthwise direction of the piezoelectric substrate. Moreover, the center electrode and the end electrodes in the widthwise direction may be connected to each other by an electrode material.

Figure 9S:
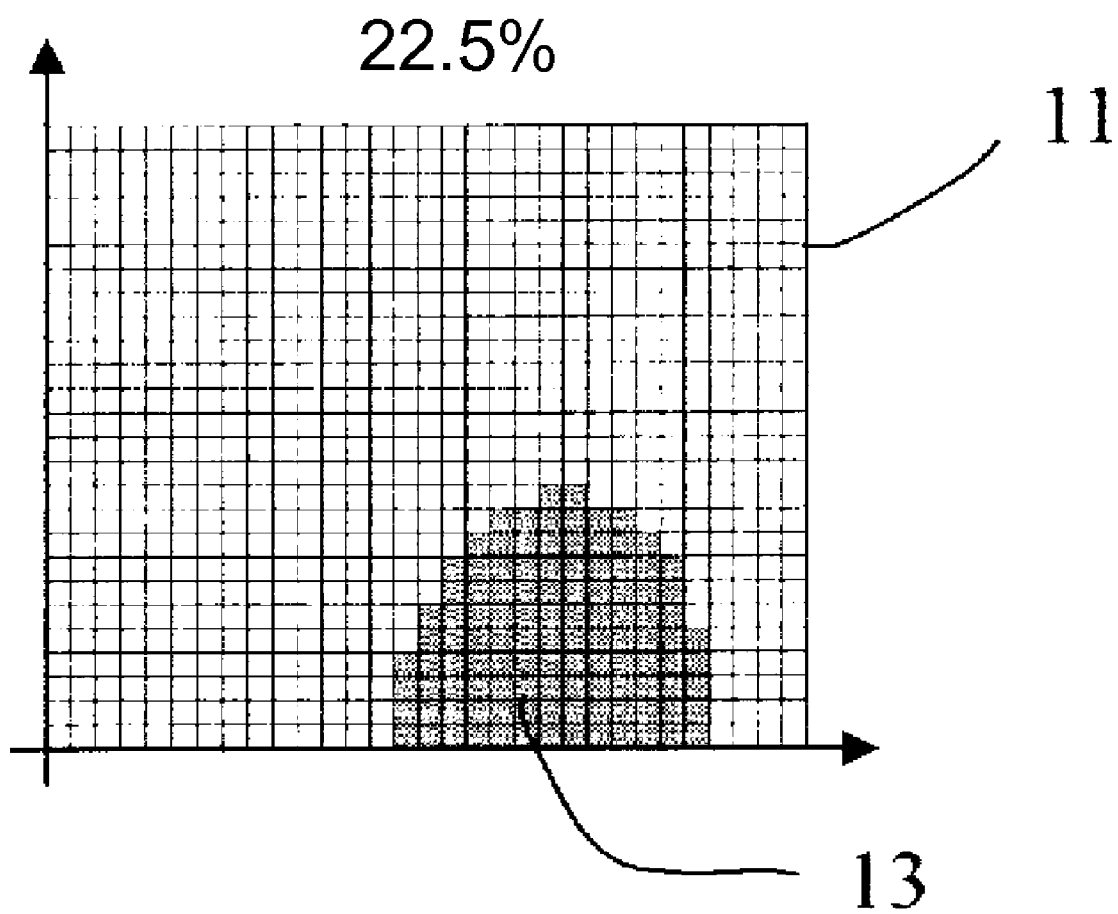
FIG. 9(S0) to FIG. 9(S8) are diagrams showing the input electrode shapes of analysis models on which computer simulation was performed.
Figure 16:
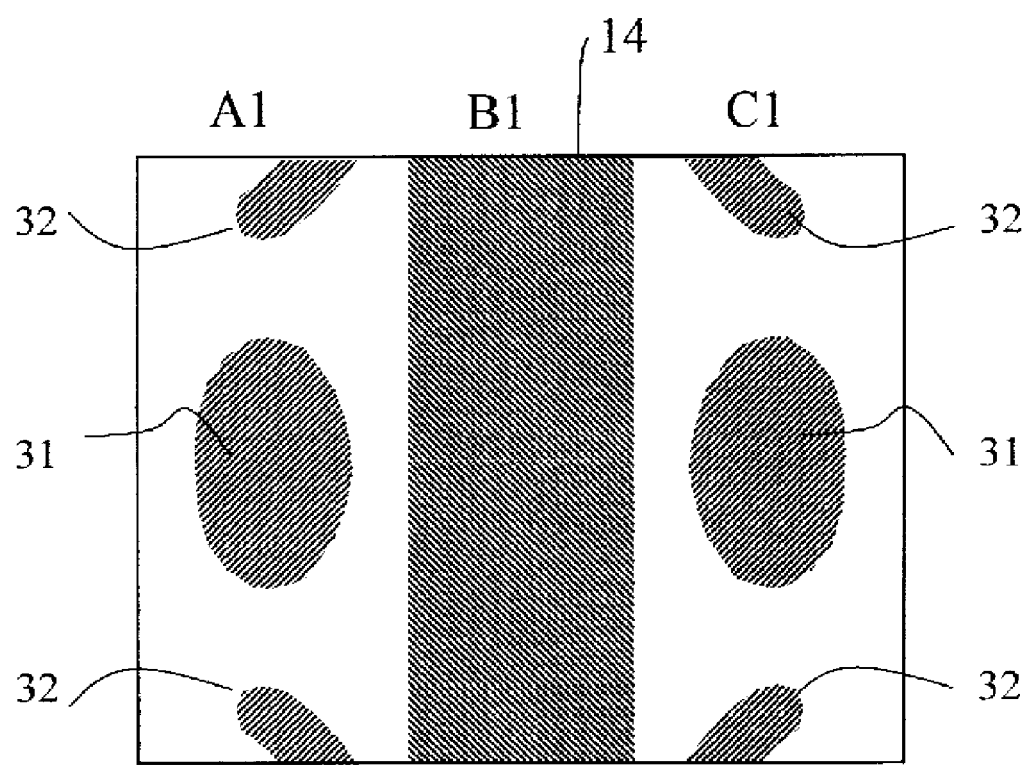
FIG. 16 is a plan view showing an exemplary piezoelectric transformer according to the present invention which includes a center electrode and end electrodes.

More specifically, as shown in FIG. 9(S6) and FIG. 16 which shows a specific embodiment of this model, not only the center electrode 31 but also island shaped electrodes 32 at both ends in the widthwise direction may be provided. In FIG. 9(S6), the center electrode 31 and the island shaped electrodes 32 at both ends are formed in a portion where strain $S_{xx}$ (strain in x-direction) is large as shown in FIG. 11. The electrode area can be determined in accordance with the strain distribution in FEM simulation and the acceptable electrostatic capacitance.

It is usually desirable that the area ratio of the partial electrode to the main surface of the piezoelectric substrate in the first input part and the second input part be 60% or less, more particularly 5% to 60%. It is preferable that the area ratio be 20% to 50%. Even in a case where the above-described area ratio is less than this range, it is possible to shift the frequency with which the efficiency is extremely reduced because of unnecessary vibration modes toward the lower frequency side by forming the aforementioned notch 30, thereby increasing the frequency band in which the efficiency can be improved.

Figure 17:
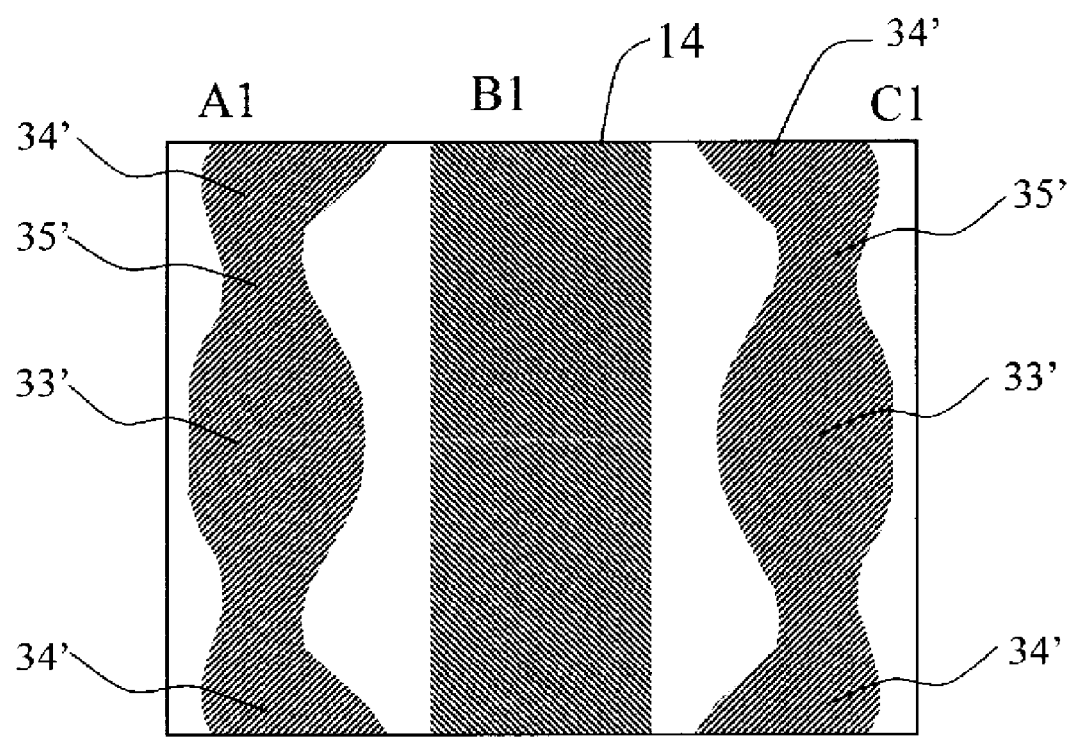
FIG. 17 is a plan view showing an exemplary piezoelectric transformer according to the present invention which includes a center electrode, end electrodes and an electrode material connecting the center electrode and the end electrodes to each other.

Furthermore, as shown in FIG. 9(S7), a portion for electrically connecting the center electrode 33 and the island shaped end electrodes 34 at both ends in the widthwise direction may be formed by an electrode material 35. If the acceptable electrostatic capacitance is large, it is possible to increase the electrode areas of the center electrode 33', the end electrodes 34' and the electrode material 35', as shown in FIG. 9(S8) and FIG. 17 which shows a specific embodiment of this model. In a case where the center electrode and the end electrodes are connected to each other as shown in FIGS. 9(S7) and 9(S8), wiring for ensuring another electrical connection to each of the electrodes is not required, thus improving convenience.

Figure 12:
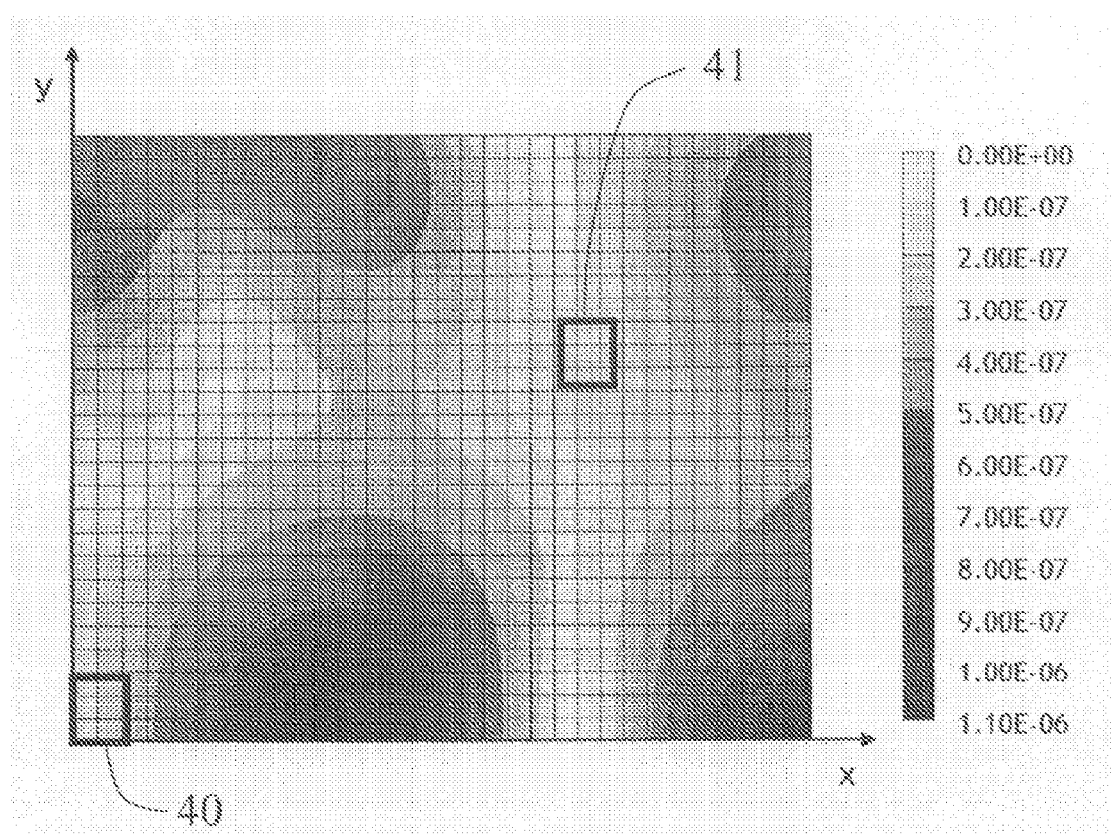
FIG. 12 shows distribution of displacement obtained by computer simulation on the piezoelectric transformer in which the input part is the whole-surface electrode.
Figure 18:
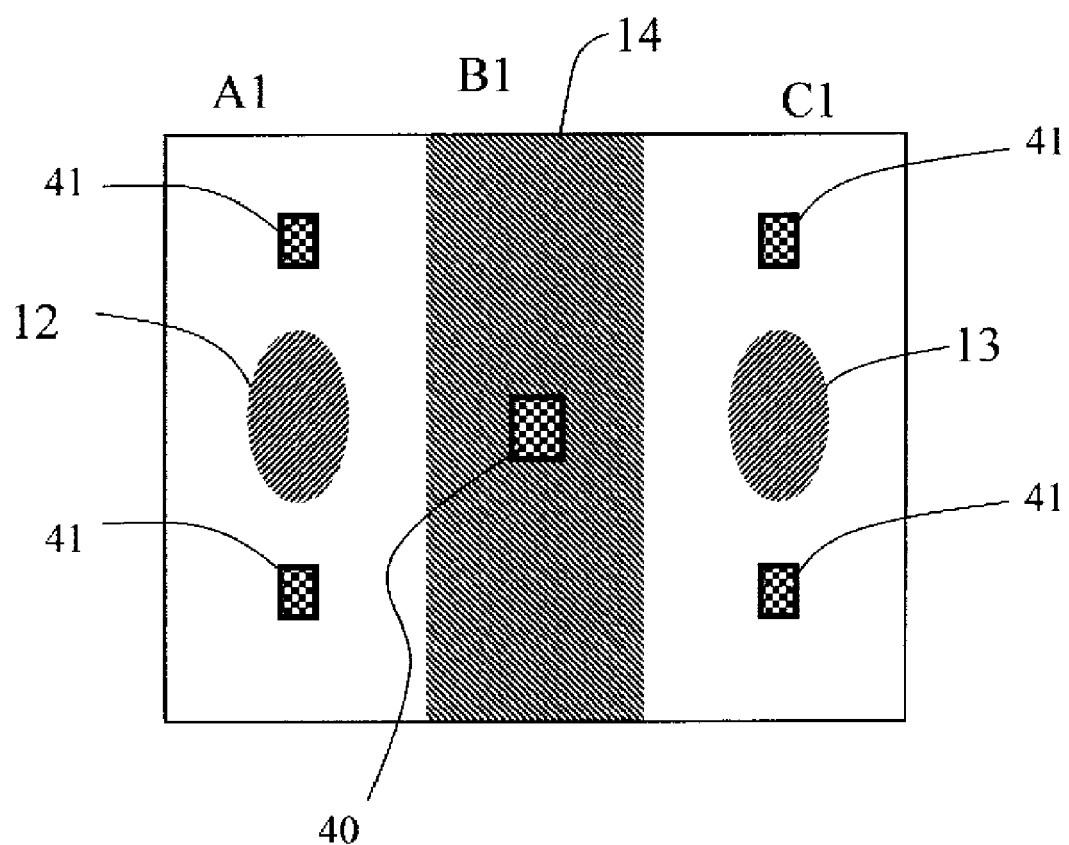
FIG. 18 is a plan view showing an exemplary piezoelectric transformer according to the present invention, in which holding portions are provided.

When the piezoelectric transformer of the present invention is implemented in a chassis of a piezoelectric transformer device or directly on a motherboard, for example, it is only necessary to fix a portion of the piezoelectric transformer in which vibration displacement is small by soldering or with adhesive or the like, or to clamp both main surfaces of the piezoelectric substrate with clamps having spring characteristics, for example. In this case, as shown in FIG. 12 and FIG. 18 which shows a specific embodiment of this model, by holding and fixing the piezoelectric transformer to another member (not shown) at holding portions 40 and 41 which are five portions of the piezoelectric transformer where vibration displacement is small, it is possible to hold the piezoelectric transformer without largely disturbing vibration. By holding and fixing the element at five places including one place around the center of the output part (holding portion 40) and four places in the input part (holding portions 41), symmetry can be kept and stable fixing can be achieved. It is desirable for fixing of the input part to use solder, electrically conductive adhesive or the like in a case where the other member has an electrode formed thereon, and to use insulating adhesive in a case where the other member has no electrode.

Figure 19:
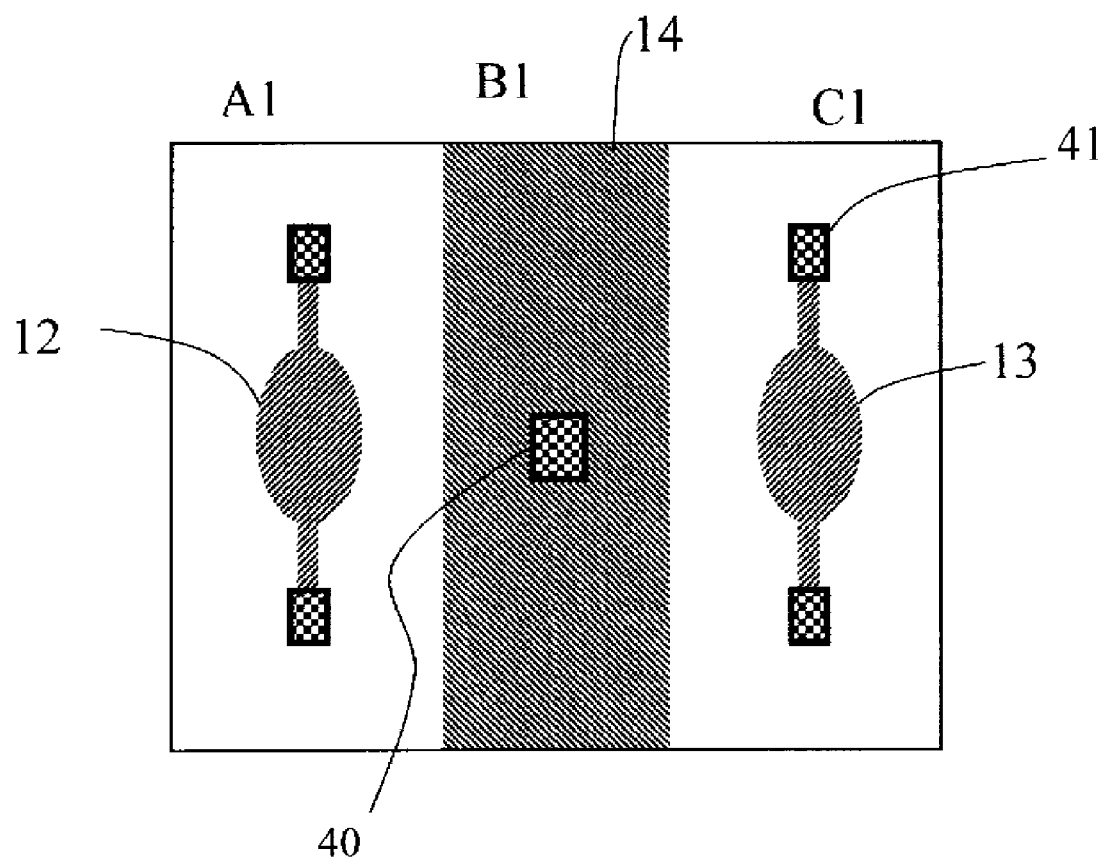
FIG. 19 is a plan view showing another exemplary piezoelectric transformer according to the present invention, in which holding portions on which electrodes extending from the input electrodes are formed are provided.

Moreover, in a case where island shaped electrodes (not shown) are formed in the portions to be held and fixed and the input partial electrodes 12 and 13 in the input part A1 and C1 are arranged to extend to those island shaped electrodes, as shown in FIG. 19, fixing of the piezoelectric transformer by soldering or the like onto the electric pattern on the substrate enables the piezoelectric transformer to be held onto another member without largely disturbing vibration. Also, electrical connection can be achieved between the piezoelectric transformer and the other member.

Figure 14:
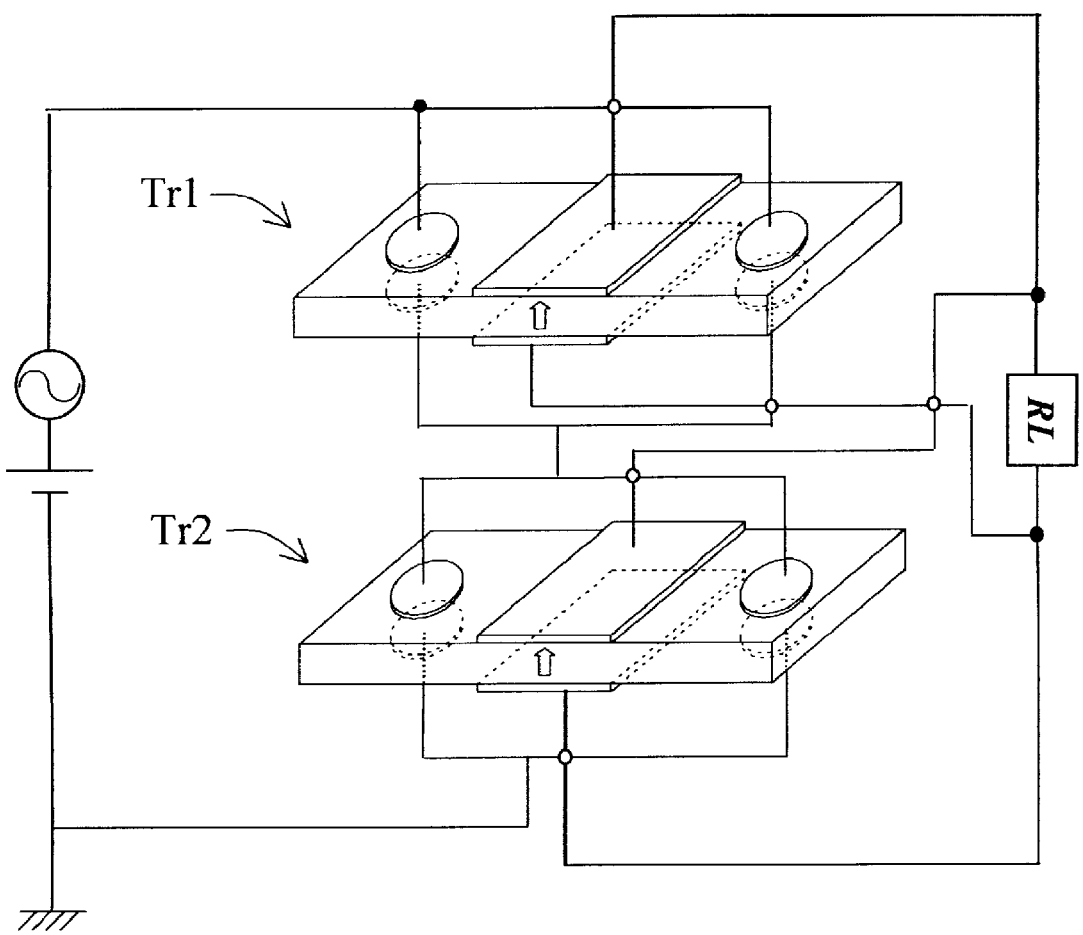
FIG. 14 is a circuit diagram of a piezoelectric transform device in which two piezoelectric transformers are connected according to the present invention.

A piezoelectric transformer device of the present invention includes a plurality of piezoelectric elements electrically connected to one another. FIG. 14 is a circuit diagram of the piezoelectric transformer. FIG. 14 shows a state where two piezoelectric transformer elements Tr1 and Tr2 are electrically connected to each other. In a case of including three or more piezoelectric transformer elements, connection can be made in a similar manner. The input parts of a plurality of piezoelectric transformers Tr1, Tr2, . . . are connected in series with respect to the input voltage. As for the output, the output parts of the piezoelectric transformer elements Tr1, Tr2, . . . are connected in parallel with respect to a load resistance. More specifically, an input circuit supplies an input to two input electrodes on the front side of the piezoelectric transformer Tr1. The input electrodes on the back side of the piezoelectric transformer Tr1 are connected to two input electrodes on the front side of the piezoelectric transformer Tr2. Two input electrodes on the back side of the piezoelectric transformer Tr2 are connected to the input ground. On the other hand, as for the output parts, it is only necessary to connect the output electrodes on the front side of the two piezoelectric transformers Tr1 and Tr2 to the positive side of the load resistance (the upper side of RL), and to connect the output electrodes on the back side of the two piezoelectric transformers Tr1 and Tr2 to the negative side of the load resistance (the lower side of RL). By connecting the input parts in series and the output parts in parallel as described above, the input electrostatic capacitance can be reduced to 1/N (where N is the number of the piezoelectric transformers). This connection method can be also used in a case where the input electrodes and the output electrodes are formed by whole-surface electrodes.

The piezoelectric transformer according to the present invention is now described in detail, referring to examples. However, the piezoelectric transformer of the present invention cannot be limited to the examples described below.

EXAMPLE 1

Computer simulation was performed on the piezoelectric transformer according to the present invention by using a finite element method.

The material for the piezoelectric transformer was assumed to be Pb(Ti, Zr)O$_3$-based piezoelectric material. In the simulation, calculation was performed where a piezoelectric constant d$_{31}$=−125 pC/m, a relative dielectric constant ∈r=1420, and Qm=1000.

Figure 8:
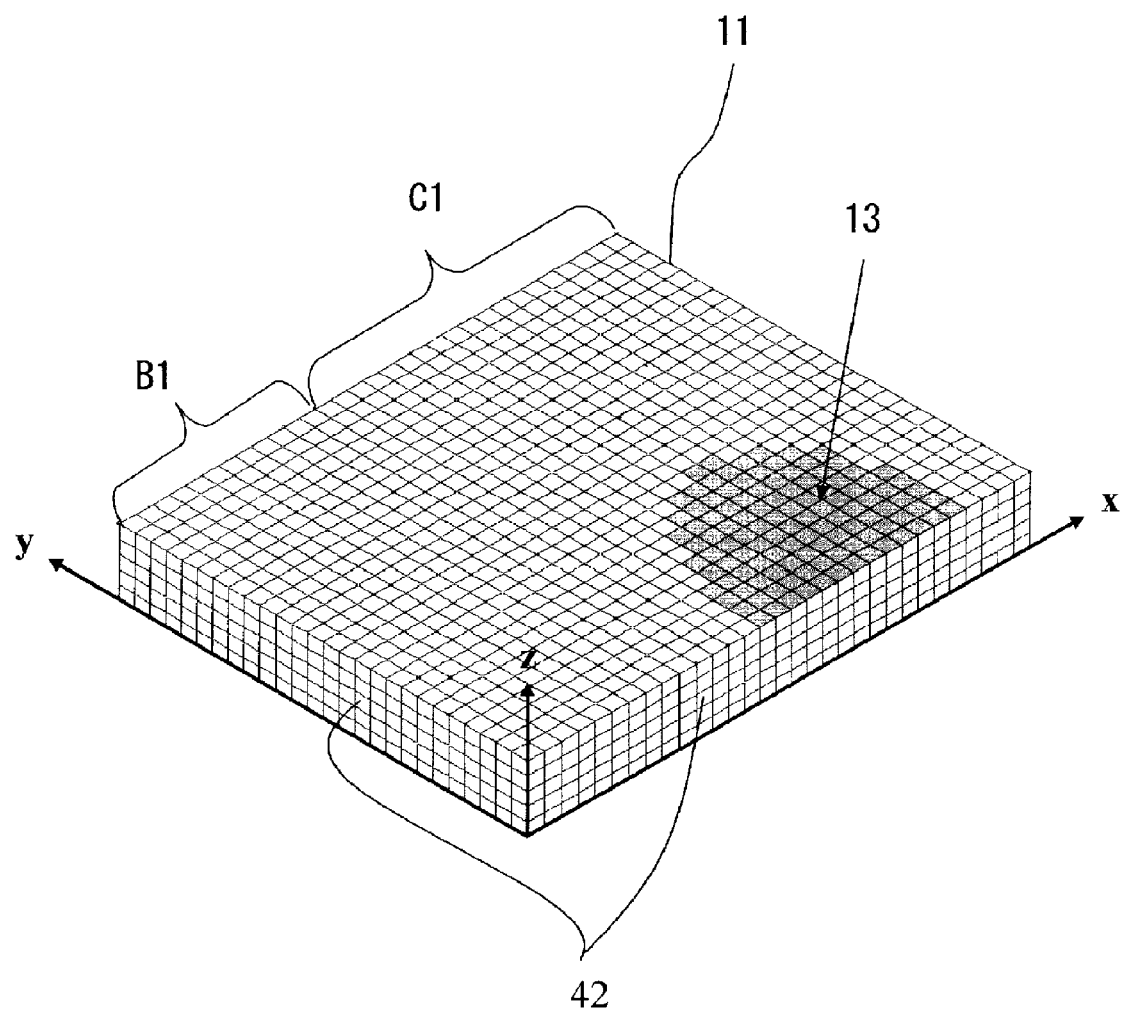
FIG. 8 is a diagram showing a finite element mesh model (quarter-symmetry model) for a piezoelectric transformer used in computer simulation.

FIG. 8 shows the mesh for the finite element model used in the simulation. Symmetry of the piezoelectric transformer was taken into consideration in the simulation. As shown in FIG. 2, the simulation was performed on the upper-right portion in that drawing by using a quarter-symmetry model. In FIG. 8, reference numeral 42 denotes a quarter-symmetry plane.

The dimensions of the piezoelectric transformer were set as follows: The length L was 31.5 mm, the width W was 26.0 mm, and the thickness T of the piezoelectric substrate was 2.1 mm. In addition, the length Lin of the input part was set to 10.5 mm, the length Lout of the output part was 10.5 mm, and the input part and the output part had a single-layer structure. The polarization direction of the piezoelectric ceramic in the input part and the output part were upward in the thickness direction.

In the simulation, calculation was performed while an alternating current voltage was directly applied to the input parts A1 and C1 and a load resistance was connected between the output electrodes 14 and 17, as shown in FIG. 6. In that calculation, the connected load resistance had RL=750Ω and the frequency was varied in a range from 150 kHz to 185 kHz.

Assuming that the input power and the output power were Pin and Pout, respectively, the efficiency was obtained by Pout/Pin. FIG. 9 shows the shape of the input electrode used in the simulation. The electrodes 12, 13, 15, and 16 had the same shape on both main surfaces of the piezoelectric substrate. FIG. 9(S0) shows a comparative example in which an input electrode 43 is formed on the whole surface of the input part C1. FIG. 9(SS) shows a model corresponding to the most desirable electrode shape according to the present invention. In this calculation, an elliptical region was not taken into consideration in the mesh generation. Thus, the electrode was formed to cover a region in which strain S$_{xx}$ was large, and therefore the electrode had a convex (semielliptical) shape in the quarter-symmetry model. In FIG. 9, the area ratio (%) of each input electrode to the input part is shown. This area ratio is defined as the area of the input electrode to the area of the main surface of the piezoelectric substrate in the respective input parts, when portions on both sides of the output part are defined as the input parts.

Figure 10A:
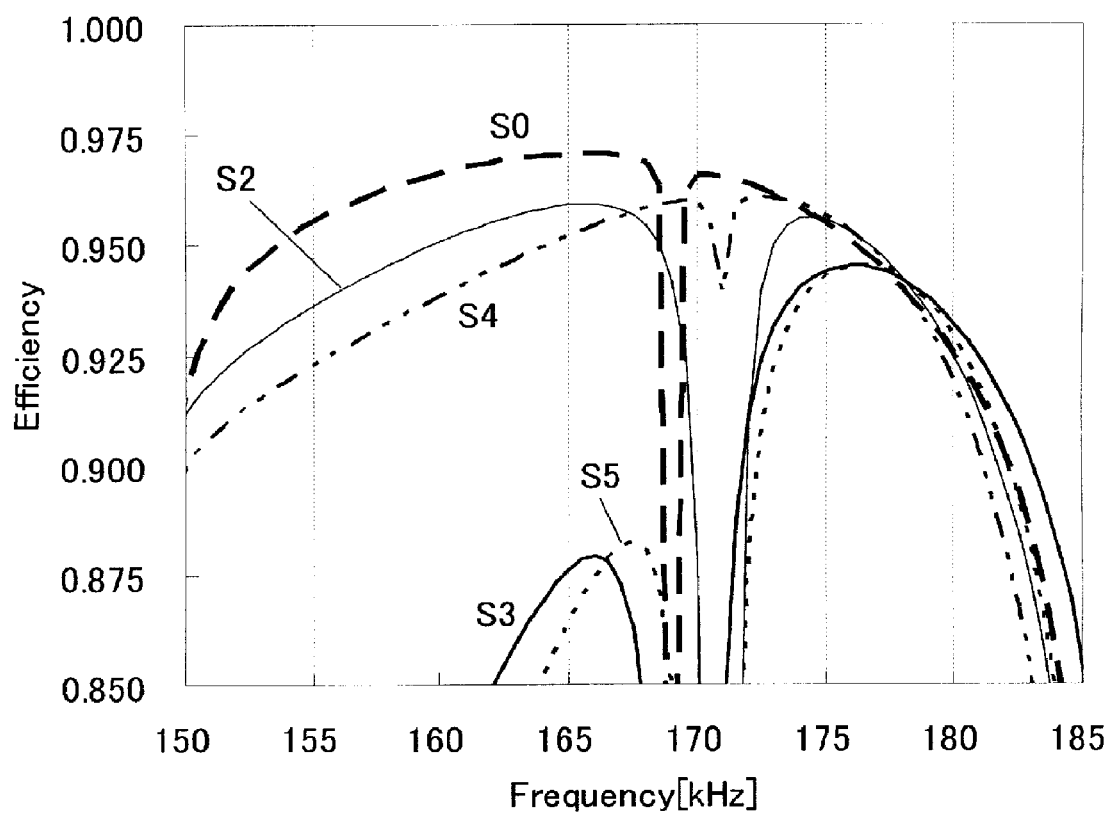
FIG. 10A shows an analysis result of the computer simulation.
Figure 10B:
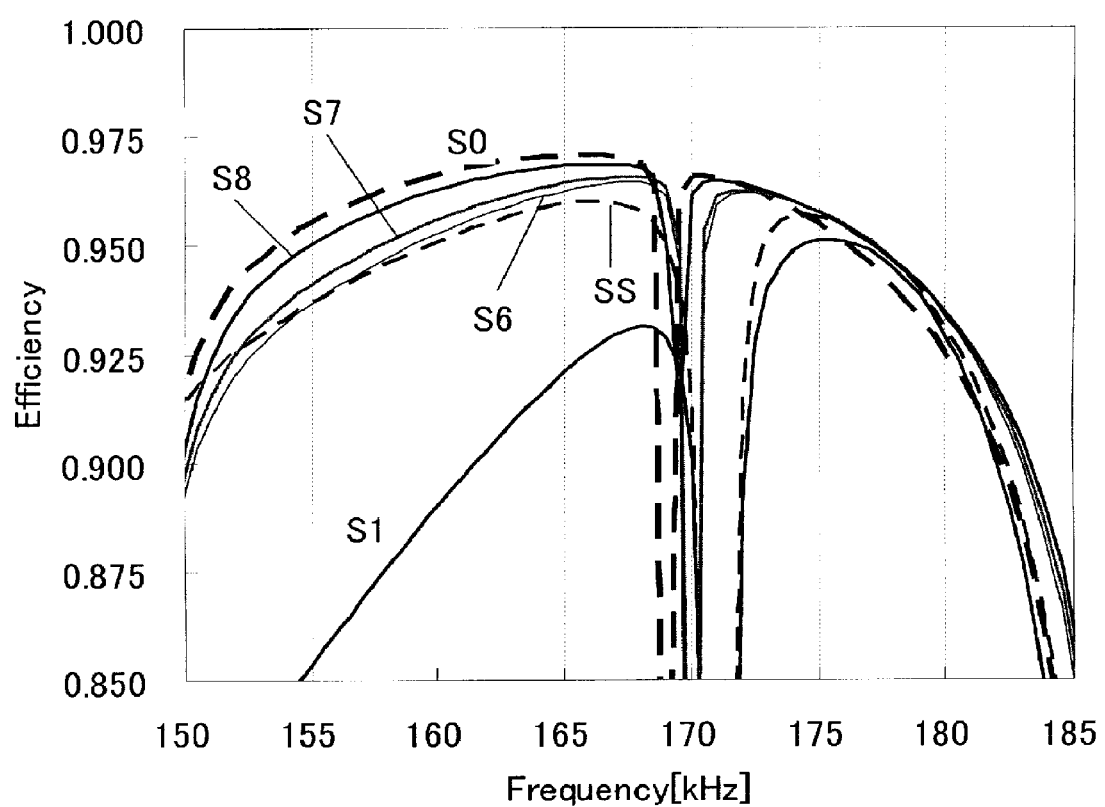
FIG. 10B shows an analysis result of the computer simulation.

FIGS. 10A and 10B show the frequency characteristics of the efficiency as the simulation results. In SS (the present invention), the efficiency is kept high in spite of reduction in the area ratio of the input electrode to 22.5%, as compared with S0 as the comparative example. On the other hand, it is found in the results for S3 (the area ratio of 30.8%) and S5 (the area ratio of 31.6%) both having a larger electrode area than SS that the efficiency is largely reduced as compared with SS. On the other hand, it is shown in the results for S2 and S4 having the same electrode area ratios as S3 and S5 that the efficiency is lower than that in SS but is still relatively high. Those show that the efficiency of the piezoelectric transformer cannot be flatly determined by the electrode area ratio on the input side only, but the place where the electrode is arranged is also important.

The vibration mode used in the piezoelectric transformer according to the present invention is a vibration mode in which a portion around the center of the input part in the widthwise direction largely expands and contracts in the transverse direction (the lengthwise direction of the piezoelectric transformer). In order to make the piezoelectric transformer operate, it is important how to excite vibration in the above-described vibration mode. For exciting that vibration, it is considered to be important to strain the portion of the input part around the center thereof in the widthwise direction, largely in the transverse direction. FIG. 11 shows the distribution of strain S$_{xx}$ as the result of analysis for S0. There is an elliptical region where strain S$_{xx}$ is large, found around the center of the input part in the strain S$_{xx}$ distribution. In SS, the electrode was formed to cover that elliptical region. From that reason, it is considered that the efficiency was able to be kept high in spite of reduction in the electrode area. Moreover, for S2 and S4, it is considered that the high efficiency was able to be kept because the electrode was formed near the region having relatively large strain S$_{xx}$. On the other hand, as for the electrodes for S3 and S5, it is considered that, because the electrode was formed at the place distant from the region having large strain S$_{xx}$, the efficiency was reduced in spite of approximately the same electrode area.

Then, models S6, S7, and S8, in which the electrode area was larger than that in SS but the electrode was formed in a region which was chosen to have as large strain S$_{xx}$ as possible, were generated and analyzed. It is found that forming of the electrode having as wide area as possible is better if the resultant capacitance is acceptable as the capacitance in the input part. From those analysis results, it can be understood that, when the electrode area is reduced, it is important to determine the arrangement of the electrode by considering the distribution of strain S$_{xx}$ shown in FIG. 11.

EXAMPLE 2

It is found that, when the electrode area is reduced to about 5% as in S1, the efficiency is reduced irrespective of selecting the region having a large strain S$_{xx}$. In particular, it is shown that the efficiency peak is smaller on the lower frequency side of 170 kHz. In a case where the electrode such as S1 has to be actually used because of impedance matching of an input circuit, restriction on a driving IC, and the like, it is desirable to use the piezoelectric transformer with a frequency around 175 kHz. However, since spurious vibration caused by an unnecessary vibration mode occurs around 170 kHz, the available frequency band is reduced.

Therefore, control of the spurious vibration was attempted by forming a rectangular notch in a peripheral portion of the piezoelectric transformer, as shown in FIG. 13. When the notch is formed at four places in the peripheral portion of the piezoelectric substrate as shown in FIG. 13, the spurious vibration caused by the unnecessary vibration can be shifted toward the lower frequency side or the effects of the spurious vibration can be reduced. Therefore, the band of the efficiency can be increased. FIG. 13(a-1) shows an analysis model in a case where no notch is formed. In the analysis, the result is shown when the electrode area ratio was reduced to 6.1%. The spurious vibration around 170 kHz is vibration within a plane like the vibration mode used as the main mode by the piezoelectric transformer, although it is not shown. Thus, when the L/W ratio of the length L and the width W of the piezoelectric transformer, the ratio L2/(L−L2) of the output part L2 and the input part (L−L2), and the like were changed, the frequency in the main mode and that in the spurious mode were also changed in a similar manner to each other and the effect of increasing the band could not be obtained.

FIG. 12 shows displacement distribution of the piezoelectric transformer having the whole-surface electrode S0. A portion having smaller displacement is shown with pale gray, and a portion having larger displacement is shown with dark gray. The result shows that, in a case where the piezoelectric transformer is fixed to a chassis of a piezoelectric transformer device or the like, fixing at five places in the smaller-displacement portions shown in FIG. 12 (squares in FIG. 12) can ensure the piezoelectric transformer to be held and fixed, while the effects on the vibration can be suppressed.

EXAMPLE 3

FIG. 14 shows a circuit diagram of a piezoelectric transformer device in which two piezoelectric transformers are connected as an exemplary piezoelectric transformer device formed by a plurality of connected piezoelectric transformers. In connection on the input side, the input parts of the two piezoelectric transformers are connected in series with respect to the input voltage. Assuming that the number of the connected piezoelectric transformers is N, the electrostatic capacitance in the input part can be reduced to 1/N of that in a single piezoelectric transformer. On the other hand, in connection on the output side, parallel connection is employed with respect to the output load. By this arrangement, it is necessary to increase the input voltage N times, but is possible to increase the output power N times. Stacking a plurality of piezoelectric transformers into one block is possible. In this case, however, the thickness of the piezoelectric transformer increases N times, and only the thickness increases as compared with the dimensions within the plane of the piezoelectric transformer, and therefore a predetermined vibration mode cannot be achieved. For that reason, it is effective to connect a plurality of piezoelectric transformers in the form of a circuit.

Figure 15:
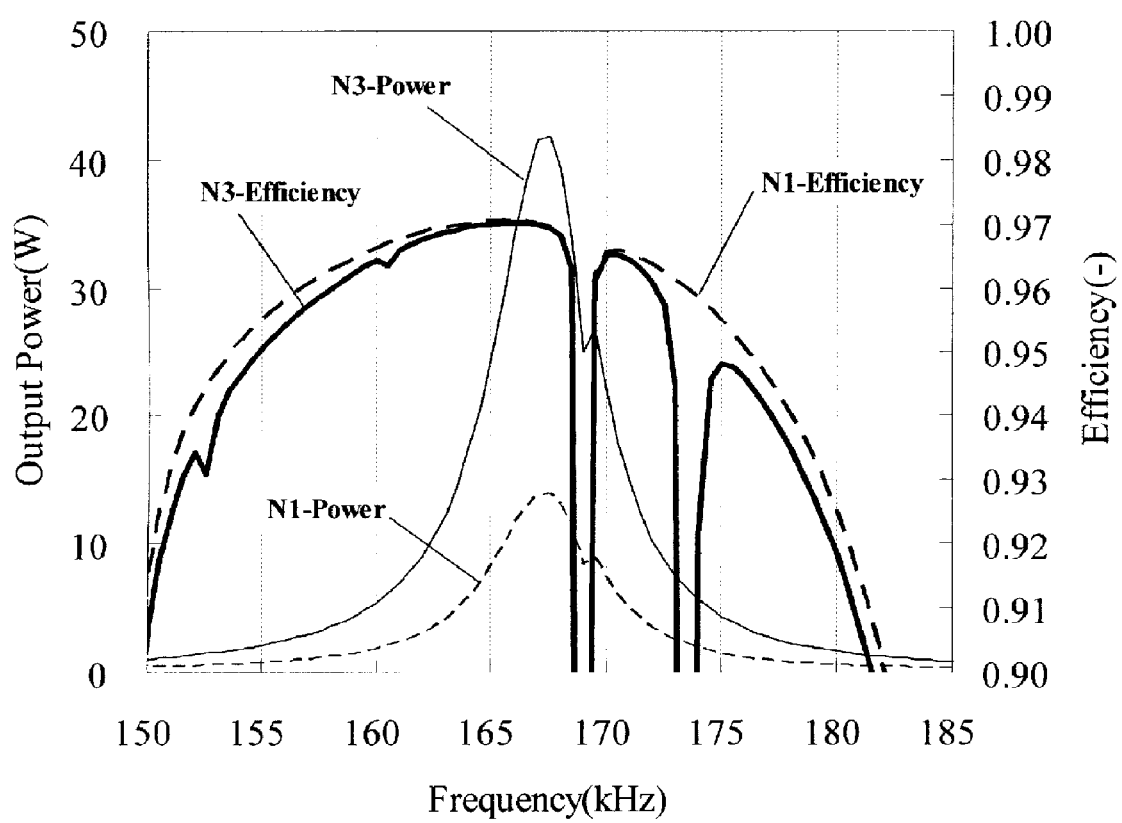
FIG. 15 is a graph showing analysis results for the piezoelectric transformer device in which a plurality of piezoelectric transformers are connected in the manner shown in FIG. 14.

FIG. 15 shows the results of simulation for a case where three piezoelectric transformers are connected. In the calculation on the case of three elements, the applied input voltage was three times as high as that in the case of a single element. The results show that the output power in the case of three elements is almost triple of that in the case of a single element. In the case of three elements, it is confirmed that unnecessary spurious vibration occurs in the efficiency graph but the efficiency is kept high, as compared with the case of a single element.

The preferred embodiments of the present invention have been described above. However, the present invention is not limited to those embodiments. Various changes and modification can be made within the scope of the claims.

The invention claimed is:

1. A piezoelectric transformer comprising:
    a piezoelectric substrate comprising a pair of main surfaces having a rectangular shape, a longitudinal direction, an area, and a center portion;
    an output part at the center portion of the piezoelectric substrate in the longitudinal direction of thereof, comprising a pair of output electrodes on both the main surfaces a longitudinal direction, and sides;
    a first input part and a second input part on each side of the output part in the longitudinal direction respectively, each comprising input electrodes on both the main surfaces, wherein
        the input electrodes of each of the first input part and the second input part opposing each other on both the main surfaces of the piezoelectric substrate, and at least one of the opposing input electrodes is a partial electrode having an area smaller than the area of the main surface of the piezoelectric substrate in the first input part and the second input part,
    wherein the main surface of the piezoelectric substrate in the first input part and the second input part includes a central portion and an end, and at least one of the input electrodes opposing each other includes a center electrode in the central portion of the main surface of the piezoelectric substrate in the first input part and the second input part, and an end electrode on the end of the main surface.

2. The piezoelectric transformer according to claim 1, wherein the main surface of the piezoelectric substrate in the first input part and the second input part includes a central portion, and
    the partial electrode is in the central portion of the main surface of the piezoelectric substrate in the first input part and the second input part.

3. The piezoelectric transformer according to claim 1, further including
    a plurality of output electrodes located within the piezoelectric substrate in the output part with a predetermined interval in a thickness direction.

4. The piezoelectric transformer according to claim 1, wherein
    both the input electrodes opposing each other are the partial electrodes.

5. The piezoelectric transformer according to claim 1, wherein the piezoelectric substrate includes a periphery and the piezoelectric transformer further comprising a notch on the periphery of the piezoelectric substrate.

6. The piezoelectric transformer according to claim 1, wherein the main surface of the piezoelectric substrate in the first input part and the second input part includes widthwise end portions and the output electrode in the output part includes a widthwise central portion, and both widthwise end portions of the main surface of the piezoelectric substrate in the first input part and the second input part and the widthwise central portion of the output electrode in the output part are holding portions for fixing to another member.

7. The piezoelectric transformer according to claim 6, further comprising an electrode on the holding portion in the first input part and the second input part, and the input electrode is arranged to extend to the holding portion.

8. A piezoelectric transformer device comprising a plurality of piezoelectric transformers according to claim 1, wherein:
    the input electrodes in the first input parts and the second input parts of the plurality of piezoelectric transformers are coupled in series; and
    the output electrodes in the output parts of the plurality of piezoelectric transformers are coupled in parallel.

9. The piezoelectric transformer according to claim 1, wherein at least one of the first input part and the second input part include a main surface area and the input electrodes include a drive frequency applicable thereto:
    the piezoelectric substrate has a length and a width, and the ratio of the length to the width in a range between 1.1 and 1.4; and
    each of the input electrodes have an area less than 60% of the main surface area of at least one of the first input part and the second input part; and
    a product of the length of the piezoelectric substrate and the drive frequency applicable to the input electrodes is in a range between 4700 and 6000 kHz/mm.

10. A piezoelectric transformer comprising:
    a piezoelectric substrate comprising a pair of main surfaces having a rectangular shape, a longitudinal direction, an area, and a center portion;
    an output part at the center portion of the piezoelectric substrate in the longitudinal direction of thereof, comprising a pair of output electrodes on both the main surfaces a longitudinal direction, and sides;

a first input part and a second input part on each side of the output part in the longitudinal direction respectively, each comprising input electrodes on both the main surfaces, wherein the input electrodes of each of the first input part and the second input part opposing each other on both the main surfaces of the piezoelectric substrate, and at least one of the opposing input electrodes is a partial electrode having an area smaller than the area of the main surface of the piezoelectric substrate in the first input part and the second input part, wherein the main surface of the piezoelectric substrate in the first input part and the second input part includes a central portion and an end, and at least one of the input electrodes opposing each other includes a center electrode in the central portion of the main surface of the piezoelectric substrate in the first input part and the second input part, and an end electrode on the end of the main surface, and the center electrode and the end electrode are connected to each other by an electrode material.

* * * * *